United States Patent
Matsunaga et al.

(10) Patent No.: US 7,782,675 B2
(45) Date of Patent: Aug. 24, 2010

(54) SEMICONDUCTOR MEMORY DEVICE AND DATA ERASE METHOD THEREOF

(75) Inventors: Yasuhiko Matsunaga, Yokohama (JP); Fumitaka Arai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 113 days.

(21) Appl. No.: 12/175,008

(22) Filed: Jul. 17, 2008

(65) Prior Publication Data

US 2009/0021982 A1 Jan. 22, 2009

(30) Foreign Application Priority Data

Jul. 18, 2007 (JP) .............................. 2007-187389

(51) Int. Cl.
*G11C 16/04* (2006.01)

(52) U.S. Cl. .............................. 365/185.17; 365/185.18; 365/185.2; 365/185.21

(58) Field of Classification Search ................................. 365/185.17–185.18, 185.2, 185.21–185.23, 365/185.29, 189.09

See application file for complete search history.

(56) References Cited

U.S. PATENT DOCUMENTS 7,301,815 B2 * 11/2007 Kurata et al. .............. 365/185.2
7,518,920 B2 * 4/2009 Kang ..................... 365/185.17

FOREIGN PATENT DOCUMENTS

JP 2005-235260 9/2005

OTHER PUBLICATIONS

U.S. Appl. No. 12/408,273, filed Mar. 20, 2009, Hashimoto, et al.

* cited by examiner

*Primary Examiner*—David Lam
(74) *Attorney, Agent, or Firm*—Oblon, Spivak, McClelland, Maier & Neustadt, L.L.P.

(57) ABSTRACT

A semiconductor memory device includes a memory cell array which includes a plurality of memory cell strings each including a plurality of memory cells and a first dummy cell, which have current paths connected in series at one end and the other end thereof, a plurality of first and second select transistors, a source line, and a bit line, wherein the first dummy cell is disposed on the source line side such that one end and the other end of the current path thereof are connected between the first select transistor and the memory cell, and a threshold voltage of the first dummy cell is higher than a neutral threshold voltage.

18 Claims, 19 Drawing Sheets

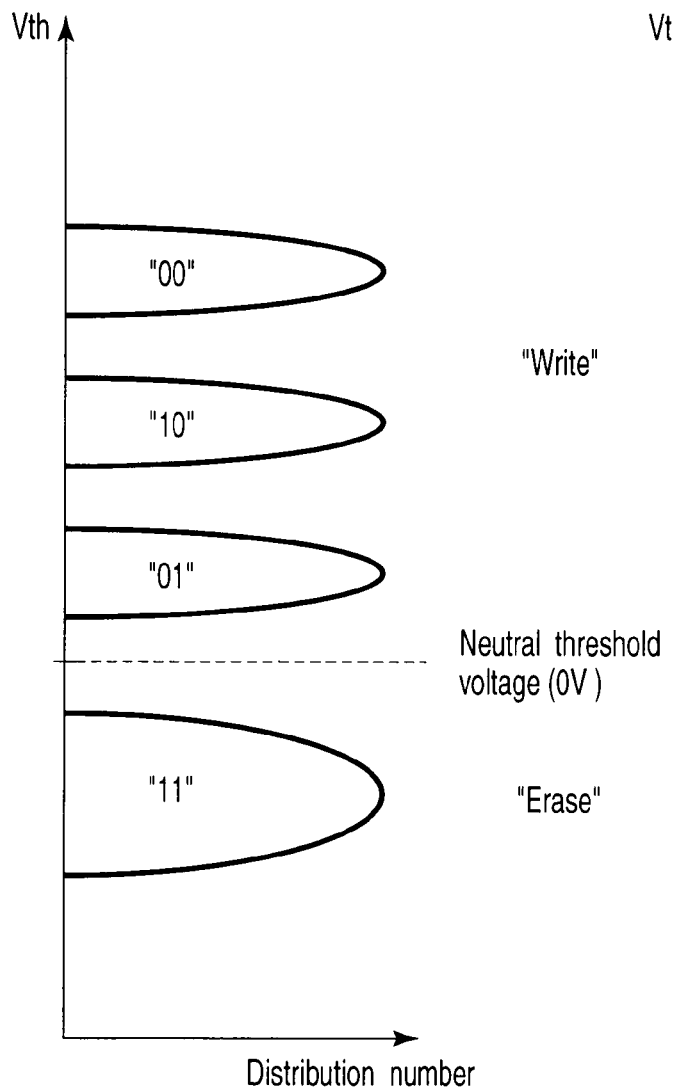
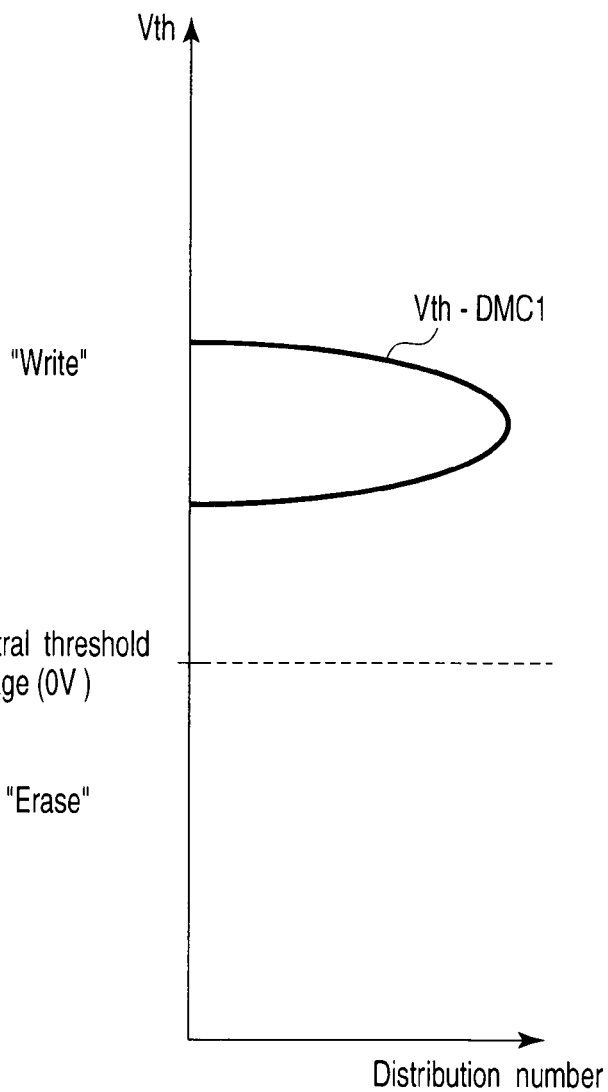
FIG. 5A
FIG. 5B

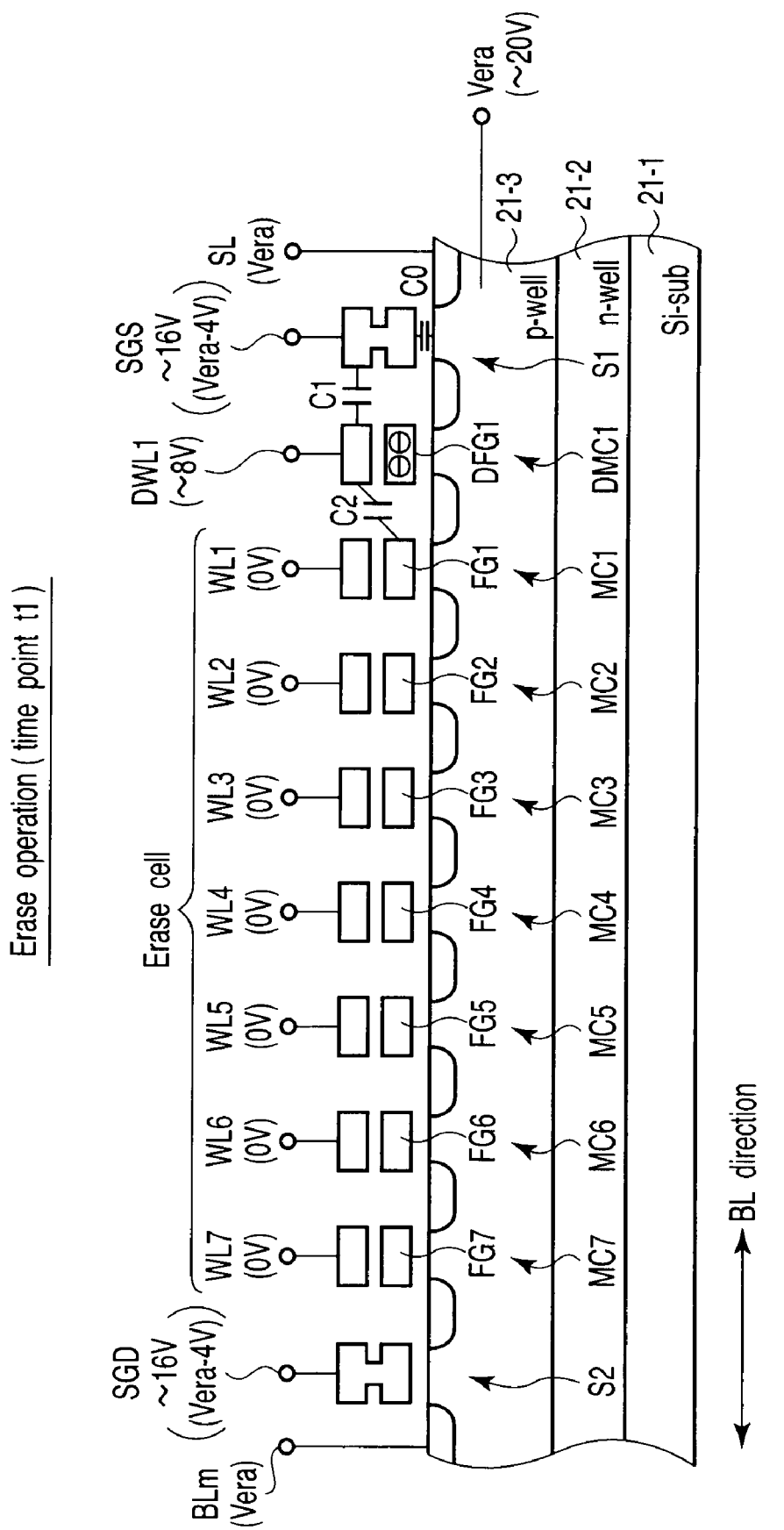
F I G. 11

CASE1 (8V is applied to DWL1, and electrons remain in DFG1)

CASE2 (0v is applied to DWL1, and electrons are not left in DFG1)

(Capacitive coupling: C1'>C1, C0'>C0)

CASE1 (voltage of P-well is raised earlier)

CASE2 (voltage of transfer transistor is raised earlier)

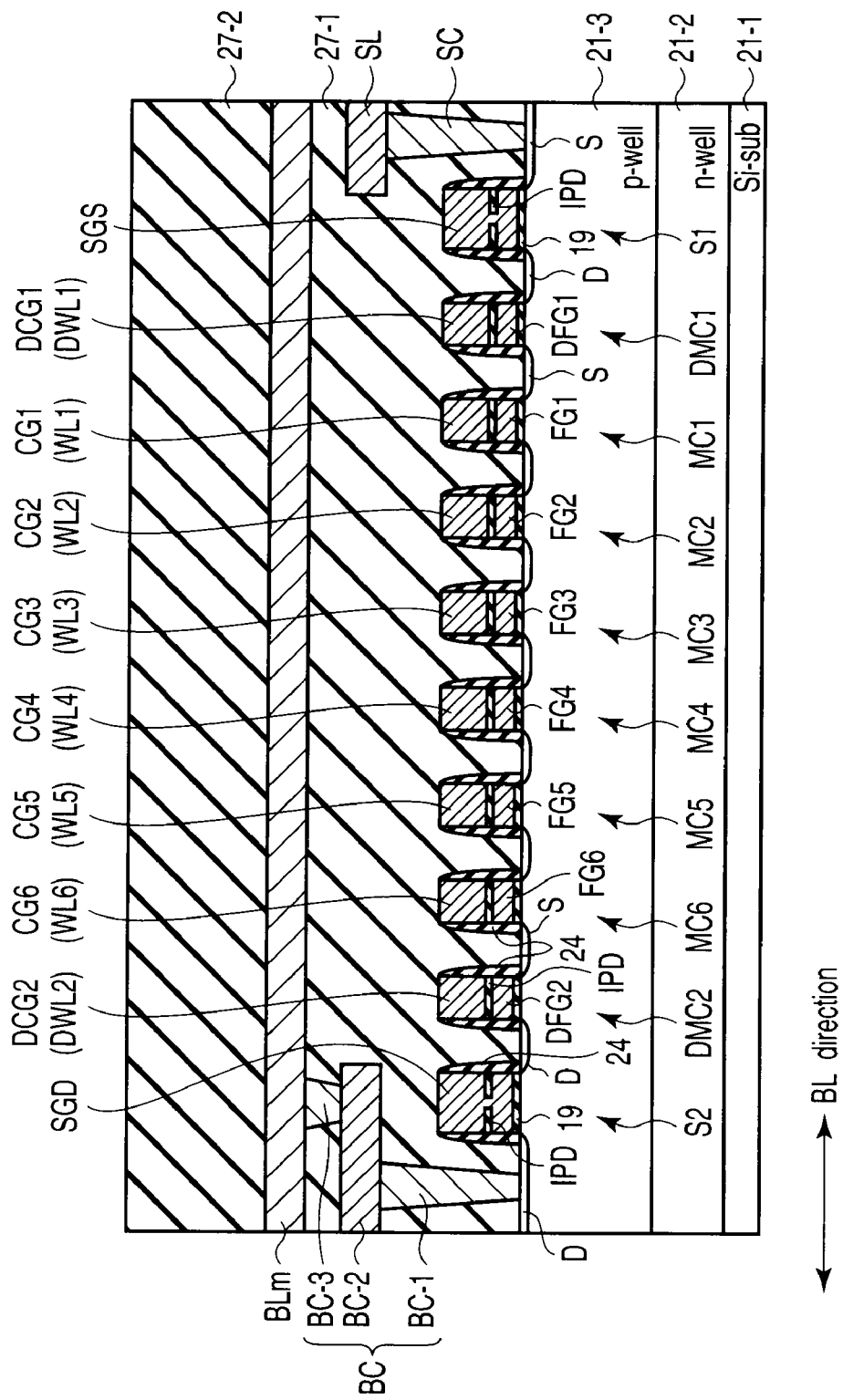
F I G. 19

SEMICONDUCTOR MEMORY DEVICE AND DATA ERASE METHOD THEREOF

CROSS-REFERENCE TO RELATED APPLICATIONS

This application is based upon and claims the benefit of priority from prior Japanese Patent Application No. 2007-187389, filed Jul. 18, 2007, the entire contents of which are incorporated herein by reference.

BACKGROUND OF THE INVENTION

1. Field of the Invention

The present invention relates to a semiconductor memory device and a data erase method thereof, and is applied, for example, to a NAND flash memory.

2. Description of the Related Art

In recent years, semiconductor memory devices, for example, NAND flash memories, have begun to be used as main memories of various electronic devices, such as portable audio devices, by virtue of their merits of large capacity and nonvolatility (see, e.g. Jpn. Pat. Appln. KOKAI Publication No. 2005-235260).

Under the circumstances, in addition to the enhancement in functions, the increase in memory capacity is a challenge to the NAND flash memory. The simplest method for realizing the increase in memory capacity is to promote microfabrication of memory cells. However, if the microfabrication of memory cells is advanced, the distance between a word line (WL) and a select gate (SGS, SGD) decreases.

As a result, an electric field between the word line (WL) and the select gate (SGS, SGD) increases, and the defect ratio of memory cells increases due to hot carriers which are excessively injected in floating electrodes (FG) of memory cells which neighbor select transistors (S1, S2). In particular, there arises such a problem that the defect ratio of memory cells neighboring the source line side select transistor (S1) increases.

On the other hand, it may be thought that the hot carriers, which are injected in the floating electrode, may be released into the semiconductor substrate by an erase operation. However, in order to release the hot carriers into the semiconductor substrate, it is necessary to make the well voltage higher, and to increase the gate voltage of the select transistor (S1, S2) by capacitive coupling with the well. If the gate voltage of the select transistor (S1, S2) is increased, however, the select transistor (S1, S2) is damaged by gate dielectric breakdown. Thus, from the standpoint of gate breakdown voltage of the select transistor (S1, S2), there is a limitation to the release of hot carriers into the semiconductor substrate.

BRIEF SUMMARY OF THE INVENTION

According to an aspect of the present invention, there is provided a semiconductor memory device comprising: a memory cell array which includes a plurality of memory cell strings each including a plurality of memory cells and a first dummy cell, which have current paths connected in series at one end and the other end thereof, a plurality of first select transistors each having a current path with one end connected to one end of a current path of an associated one of the memory cell strings, and a plurality of second select transistors each having a current path with one end connected to the other end of the current path of an associated one of the memory cell strings; a source line which is electrically connected to the other end of the current path of an associated one of the first select transistors; and a bit line which is electrically connected to the other end of the current path of an associated one of the second select transistors, wherein the first dummy cell is disposed on the source line side such that one end and the other end of the current path thereof are connected between the first select transistor and the memory cell, and a threshold voltage of the first dummy cell is higher than a neutral threshold voltage.

According to another aspect of the present invention, there is provided a semiconductor memory device comprising: a memory cell array which includes a plurality of memory cell strings each including a plurality of memory cells, a first dummy cell and a second dummy cell, which have current paths connected in series at one end and the other end thereof, a plurality of first select transistors each having a current path with one end connected to one end of a current path of an associated one of the memory cell strings, and a plurality of second select transistors each having a current path with one end connected to the other end of the current path of an associated one of the memory cell strings; a source line which is electrically connected to the other end of the current path of an associated one of the first select transistors; and a bit line which is electrically connected to the other end of the current path of an associated one of the second select transistors, wherein the first dummy cell is disposed on the source line side such that one end and the other end of the current path thereof are connected between the first select transistor and the memory cell, and a threshold voltage of the first dummy cell is higher than a neutral threshold voltage, and the second dummy cell is disposed on the bit line side such that one end and the other end of the current path thereof are connected between the second select transistor and the memory cell.

According to still another aspect of the present invention, there is provided a data erase method of a semiconductor memory device including a memory cell array which includes a plurality of memory cell strings each including a plurality of memory cells and a first dummy cell, which have current paths connected in series at one end and the other end thereof, a plurality of first select transistors each having a current path with one end connected to one end of a current path of an associated one of the memory cell strings, and a plurality of second select transistors each having a current path with one end connected to the other end of the current path of an associated one of the memory cell strings, the method comprising: applying an erase voltage to a semiconductor substrate, applying a reference voltage to a word line which is connected to a control electrode of the memory cell, and applying a voltage, which has a value between the reference voltage and the erase voltage, to a first dummy word line which is connected to a control electrode of the first dummy cell.

BRIEF DESCRIPTION OF THE SEVERAL VIEWS OF THE DRAWING

FIG. 5A is a threshold distribution diagram for describing the semiconductor memory device according to the first embodiment, and shows threshold distributions of memory cells;

FIG. 5B is a threshold distribution diagram for describing the semiconductor memory device according to the first embodiment, and shows a threshold distribution of a first dummy cell;

FIG. 11 is a cross-sectional view showing a relationship in voltage in the bit line direction at a time of an erase operation according to the first embodiment;

FIG. 19 is a cross-sectional view, taken in the bit line direction, for describing the semiconductor memory device according to the second embodiment;

DETAILED DESCRIPTION OF THE INVENTION

Outline

Figure 1:
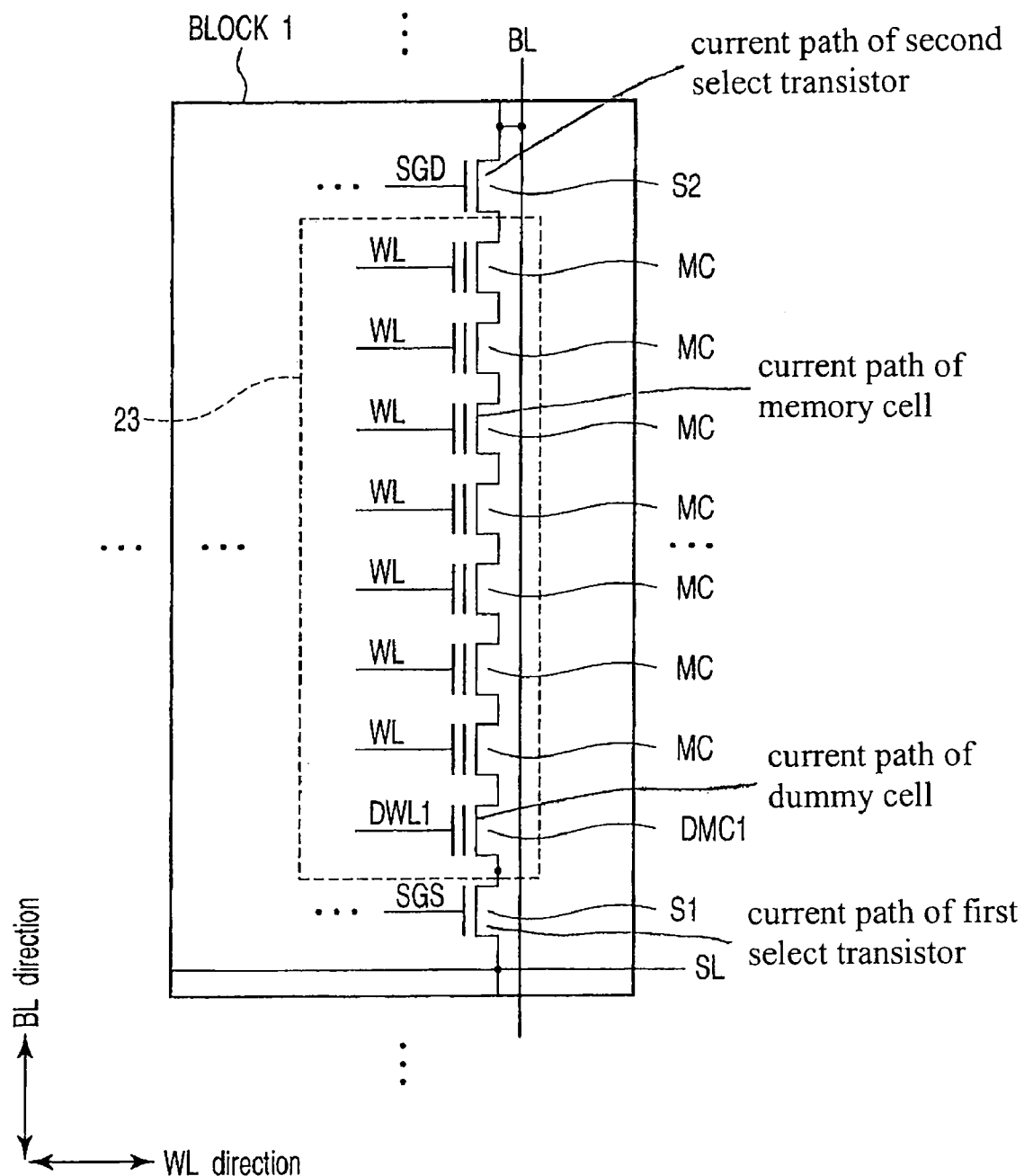
FIG. 1 is a circuit diagram for describing a semiconductor memory device according to the outline of the present invention.

To begin with, the outline of the present invention is described with reference to FIG. 1 and FIG. 2. FIG. 1 is a circuit diagram showing a semiconductor memory device according to the outline of the invention.

In this outline, there is proposed a semiconductor memory device which can reduce a defect ratio of memory cells, and can prevent damage to a select transistor.

Figure 2A:
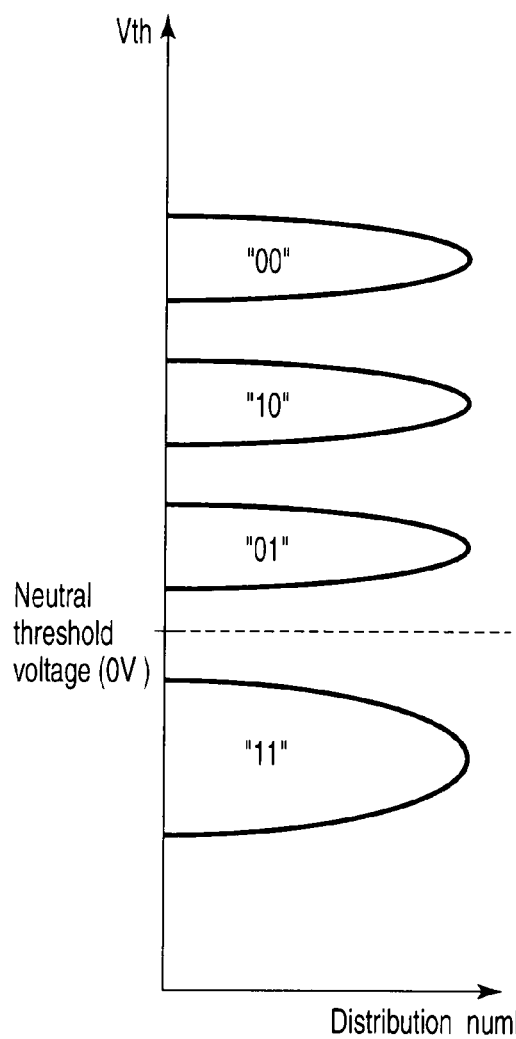
FIG. 2A is a threshold distribution diagram for describing the semiconductor memory device according to the outline of the invention, and shows threshold distributions of memory cells.
Figure 2B:
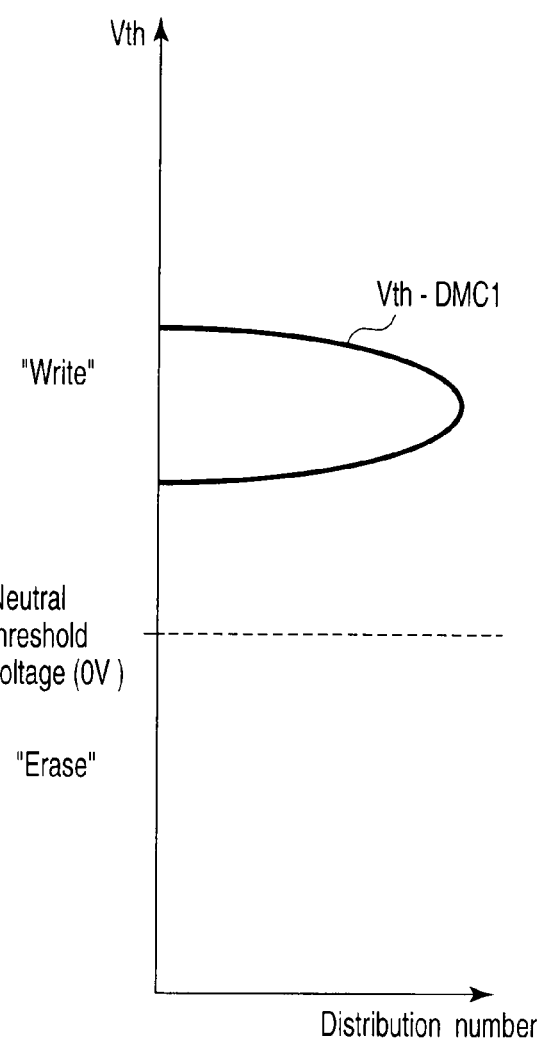
FIG. 2B is a threshold distribution diagram for describing the semiconductor memory device according to the outline of the invention, and shows a threshold distribution of a first dummy cell.

For example, the structure of this semiconductor memory device is shown in FIG. 1 and FIG. 2. FIG. 1 is a circuit diagram showing the semiconductor memory device according to the outline of the invention. FIG. 2A shows threshold distributions of memory cells, and FIG. 2B shows a threshold distribution of a first dummy cell.

As shown in FIG. 1, the semiconductor memory device, which is described here, includes a memory cell array 11. The memory cell array 11 includes a plurality of memory cell strings 23 each including a plurality of memory cells MC and a first dummy cell DMC1, which have current paths connected in series at one end and the other end thereof; a plurality of first select transistors S1 each having a current path with one end connected to one end of the current path of the associated memory cell string 23; and a plurality of second select transistors S2 each having a current path with one end connected to the other end of the current path of the associated memory cell string 23. The semiconductor memory device further includes a source line SL which is electrically connected to the other end of the current path of each of the first select transistors S1, and bit lines BL each of which is electrically connected to the other end of the current path of the associated select transistor S2. The first dummy cell DMC1 is disposed on the source line SL side such that one end and the other end of the current path thereof are connected between the first select transistor S1 and the memory cell MC.

In addition, as shown in FIG. 2A and FIG. 2B, the threshold voltage of the first dummy cell DMC1 is higher than a neutral threshold voltage.

The neutral threshold voltage, in this context, refers to a threshold voltage for determining an "erase state" ("11") and a "write state" ("01", "10", "00") of the memory cell MC, as shown in FIG. 2A. In this example, the neutral threshold voltage is 0V. The memory cell MC in this example is a multilevel memory cell which is configured to be able to discriminate four threshold voltages (four values).

As described above, the semiconductor memory device in this description includes the first dummy cell DMC1 which is disposed on the source line SL side such that one end and the other end of the current path thereof are connected between the first select transistor S1 and the memory cell MC, and the threshold voltage thereof is higher than the neutral threshold voltage.

Thus, even in the case where the electric field between the word line WL and the select gate SGS increases with the progress of microfabrication and hot carriers are excessively injected in the floating electrode of the first dummy cell DMC1 that neighbors the first select transistor S1, the first dummy cell DMC1 functions as a dummy, and the plural memory cells MC of the memory cell string 23 can be protected. Therefore, the defect ratio of memory cells MC can be decreased.

Further, the threshold voltage Vth-DMC1 of the first dummy cell DMC1 is higher than the neutral threshold voltage. In other words, this means that the first dummy cell DMC1 is not completely set in an erase state, and carriers (electrons) remain in the floating electrode of the first dummy cell DMC1.

Thus, even in the case where the gate voltage of the select transistor S1 is increased by capacitive coupling with the well in the erase operation, since the threshold voltage Vth-DMC1 of the first dummy cell DMC1 is higher than the neutral threshold voltage (carriers (electrons) remain in the floating electrode of the first dummy cell DMC1), the electric field intensity of the gate voltage of the select transistor S1 can be reduced. The reason for this is that the electric field intensity of the gate voltage of the select transistor S1 in the erase operation can be relaxed to some degree by the carriers (electrons) remaining in the floating electrode of the first dummy cell DMC1. Since the threshold voltage Vth-DMC1 of the first dummy cell DMC1 is higher than the neutral threshold voltage, it becomes possible to prevent damage to the select transistor S1 due to gate dielectric breakdown.

Besides, the distribution width of the threshold voltage Vth-DMC1 of the first dummy cell DMC1 may be greater than the distribution width of the "write state" ("01", "10", "00") of the memory cell MC. The reason for this is that the first dummy cell DMC1 is not required to store data.

In addition, microfabrication can advantageously be achieved in that the structure of the select transistor S1 can be made finer to a degree beyond the limit of the gate breakdown voltage of the select transistor S1.

As has been described above, according to the above-described structure, the defect ratio of memory cells can be decreased, and damage to the select transistor can be prevented.

Next, a description is given of some embodiments of the invention, which are considered to be the best modes. In the description below, common parts are denoted by common reference numerals throughout the drawings. In the embodiments to be described below, NAND flash memories are exemplified as semiconductor memory devices.

First Embodiment

1. Entire Structure

Figure 3:
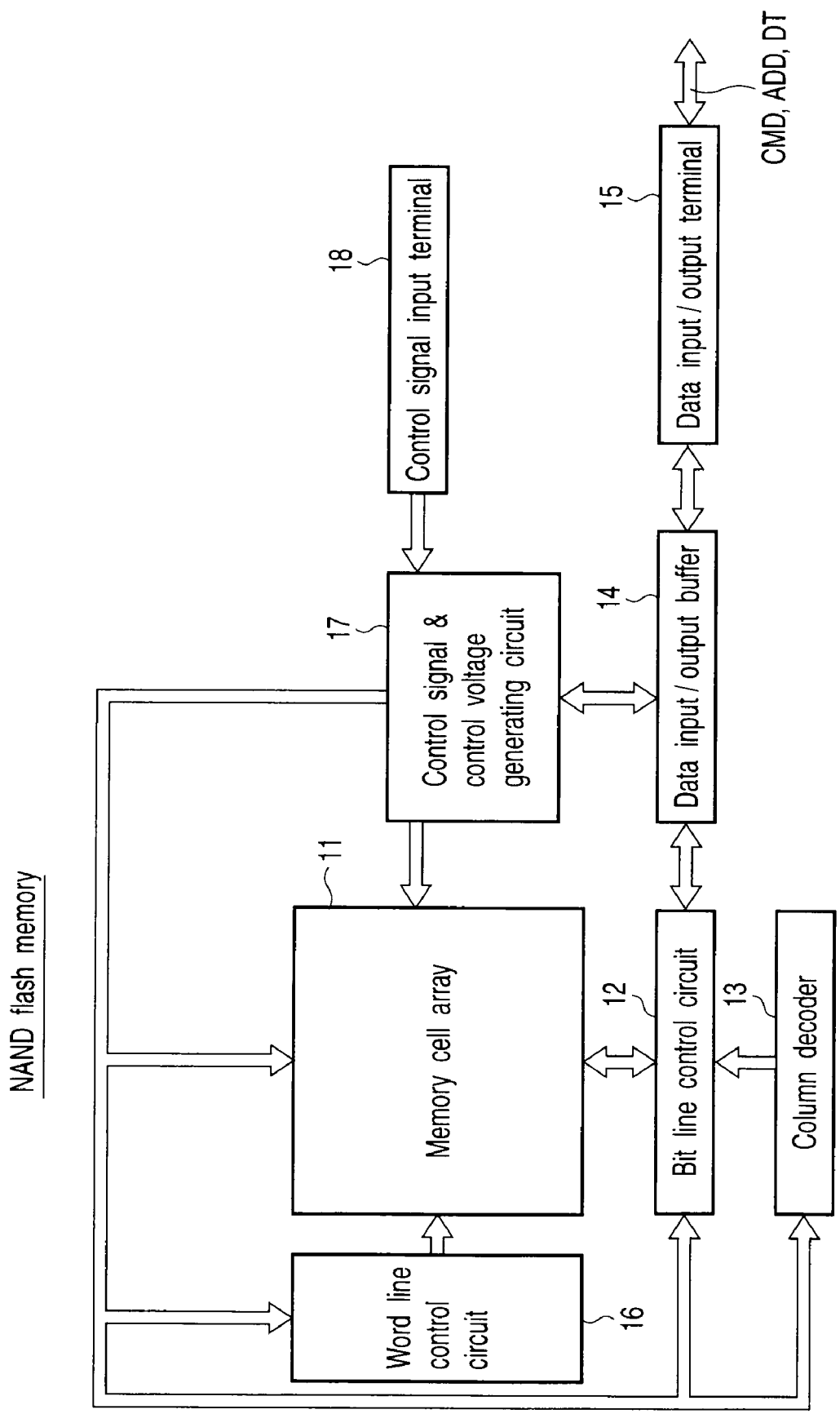
FIG. 3 is a block diagram showing the entire structure of a semiconductor memory device according to a first embodiment of the present invention.

Next, a semiconductor memory device according to a first embodiment of the invention is described. To begin with, referring to FIG. 3, a description is given of the entire structure of the semiconductor memory device according to the first embodiment. FIG. 3 is a block diagram showing a NAND flash memory according to this embodiment.

As shown in FIG. 3, the NAND flash memory comprises a memory cell array 11, a bit line control circuit 12, a column decoder 13, a data input/output buffer 14, a data input/output terminal 15, a word line control circuit 16, a control signal & control voltage generating circuit 17, and a control signal input terminal 18.

The memory cell array 11 is composed of a plurality of blocks. The word line control circuit 16 for controlling word lines, the bit line control circuit 12 for controlling bit lines and the control signal & control voltage generating circuit 17 are connected to the memory cell array 11.

The bit line control circuit 12 reads data of memory cells in the memory cell array 11 via the bit lines, and detects the states of the memory cells in the memory cell array 11 via the bit lines. In addition, the bit line control circuit 12 executes data write in the memory cells by applying write control voltages to the memory cells in the memory cell array 11 via the bit lines. The column decoder 13, the data input/output buffer 14 and the control signal & control voltage generating circuit 17 are connected to the bit line control circuit 12.

Data memory circuits (not shown) are provided in the bit line control circuit 12, and the data memory circuits are selected by the column decoder 13. The data of the memory cells, which are read into the data memory circuits, are output to the outside from the data input/output terminal 15 via the data input/output buffer 14. The data input/output terminal 15 is connected to, for example, a host device which is disposed outside the NAND flash memory.

The host device is, for instance, a microcomputer, which receives data that is output from the data input/output terminal 15. Further, the host device outputs various commands CMD which control the operation of the NAND flash memory, addresses ADD and data DT. Write data, which is input to the data input/output terminal 15 from the host device, is delivered via the data input/output buffer 14 to the data memory circuits (not shown) which are selected by the column decoder 13. On the other hand, the commands and addresses are delivered to the control signal & control voltage generating circuit 17.

The word line control circuit 16 selects the word lines in the memory cell array 11, and applies voltages necessary for data read, write or erase to the selected word lines.

The control signal & control voltage generating circuit 17 is connected to the memory cell array 11, bit line control circuit 12, column decoder 13, data input/output buffer 14 and word line control circuit 16. These connected structural circuits are controlled by the control signal & control voltage generating circuit 17. The control signal & control voltage generating circuit 17 is connected to the control signal input terminal 18, and is controlled by control signals, such as an ALE (address latch enable) signal, which are input from the host device via the control signal input terminal 18.

The word line control circuit 16, bit line control circuit 12, column decoder 13 and control signal & control voltage generating circuit 17 constitute a write circuit and a read circuit.

2. Structure Example of the Block

Figure 4:
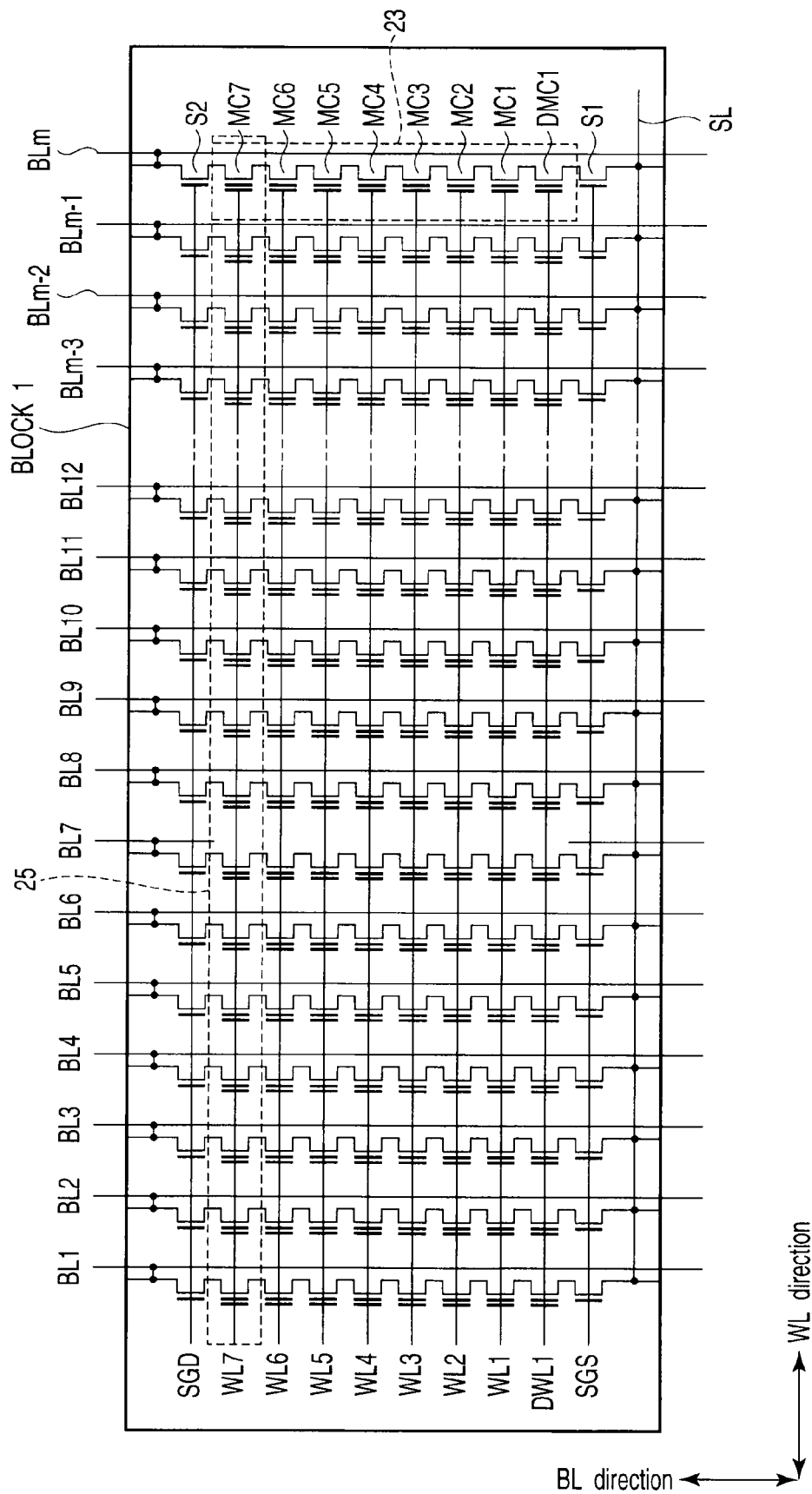
FIG. 4 is a circuit diagram showing one block of the semiconductor memory device according to the first embodiment.

Next, a structure example of the blocks, which constitute the memory cell array 11, is described with reference to FIG. 4. In this description, one block BLOCK1 is exemplified. In the case of this example, the memory cells in the block BLOCK1 are erased batchwise. In other words, the block is an erase unit.

The block BLOCK1 is composed of a plurality of memory cell strings 23 which are arranged in the word line direction (WL direction), first and second select transistors S1 and S2, a source line SL, and bit lines BL1 to BLm.

The memory cell string 23 comprises seven memory cells MC1 to MC7 having series-connected current paths, and a first dummy cell DMC1. In this example, the memory cell string 23 is composed of seven memory cells MC1 to MC7. However, the memory cell string 23 may be composed of two or more memory cells, and the number of memory cells is not limited to seven.

The memory cells MC1 to MC7 have current paths which are connected in series at one end and the other end thereof between the neighboring memory cells. Each of the memory cells MC1 to MC7 includes a gate insulation film, a floating electrode, an inter-gate insulation film and a control electrode, which are successively stacked on the semiconductor substrate.

The first dummy cell DMC1 is disposed on the source line SL side such that one end and the other end of the current path thereof are connected between the first select transistor S1 and the memory cell MC1. The first dummy cell DMC1 has the same structure as the memory cells MC1 to MC7.

One end of the current path of the first select transistor S1 is connected to one end of the current path of the memory cell string 23.

One end of the current path of the second select transistor S2 is connected to the other end of the current path of the memory cell string 23.

The source line SL is connected to the other end of the current path of the first select transistors S1. In addition, the source line SL is shared by two blocks which neighbor in the bit line direction.

Each of the bit lines BL1 to BLm is connected to the other end of the current path of the associated second select transistor S2.

Word lines WL1 to WL7 extend in a word line (WL) direction, and are commonly connected to a plurality of memory cells MC1 to MC7 which are arranged in the WL direction. A first dummy word line DWL1 extends in the WL direction, and is commonly connected to a plurality of first dummy cells DMC1 which are arranged in the WL direction. A select gate line SGS extends in the WL direction, and is commonly connected to a plurality of first select transistors S1 which are arranged in the WL direction. A select gate line SGD extends in the WL direction, and is commonly connected to a plurality of second select transistors S2 which are arranged in the WL direction.

A page 25 is present in each of the word lines WL1 to WL7. For example, as indicated by a broken-line box in FIG. 4, a page 25 is present in the word line WL1. Since a data read operation and a data write operation are executed in units of the page 25, the page 25 is a data read unit and a data write unit.

3. Threshold Distribution

Next, the threshold distributions of the memory cells MC1 to MC7 and the first dummy cell DMC1 are described with reference to FIG. 5.

As shown in FIG. 5A, the threshold distributions of the memory cells MC1 to MC7 according to this embodiment are configured such that each memory cell stores four data (four values) of "11", "01", "10" and "00" in the order from the lowest threshold voltage. However, the threshold distribution of the memory cells MC1 to MC7 may be configured such that each memory cell stores not only the four values, but also two values or multiple values, such as 2 values, 8 values, 16 values and 32 values.

As shown in FIG. 5A, a threshold voltage for determining an "erase state" ("11") and a "write state" ("01", "10", "00") of the memory cell, MC1 to MC7, is defined as "neutral threshold voltage". In the case of the present embodiment, the neutral threshold voltage is 0V.

As shown in FIG. 5B, the threshold voltage Vth-DMC1 of the first dummy cell DMC1 is configured to be higher than the neutral threshold voltage. The distribution width of the threshold voltage Vth-DMC1 may be greater than the distribution width of the "write state" ("01", "10", "00") of the memory cell MC.

4. Example of Cross-Sectional Structure

Figure 6:
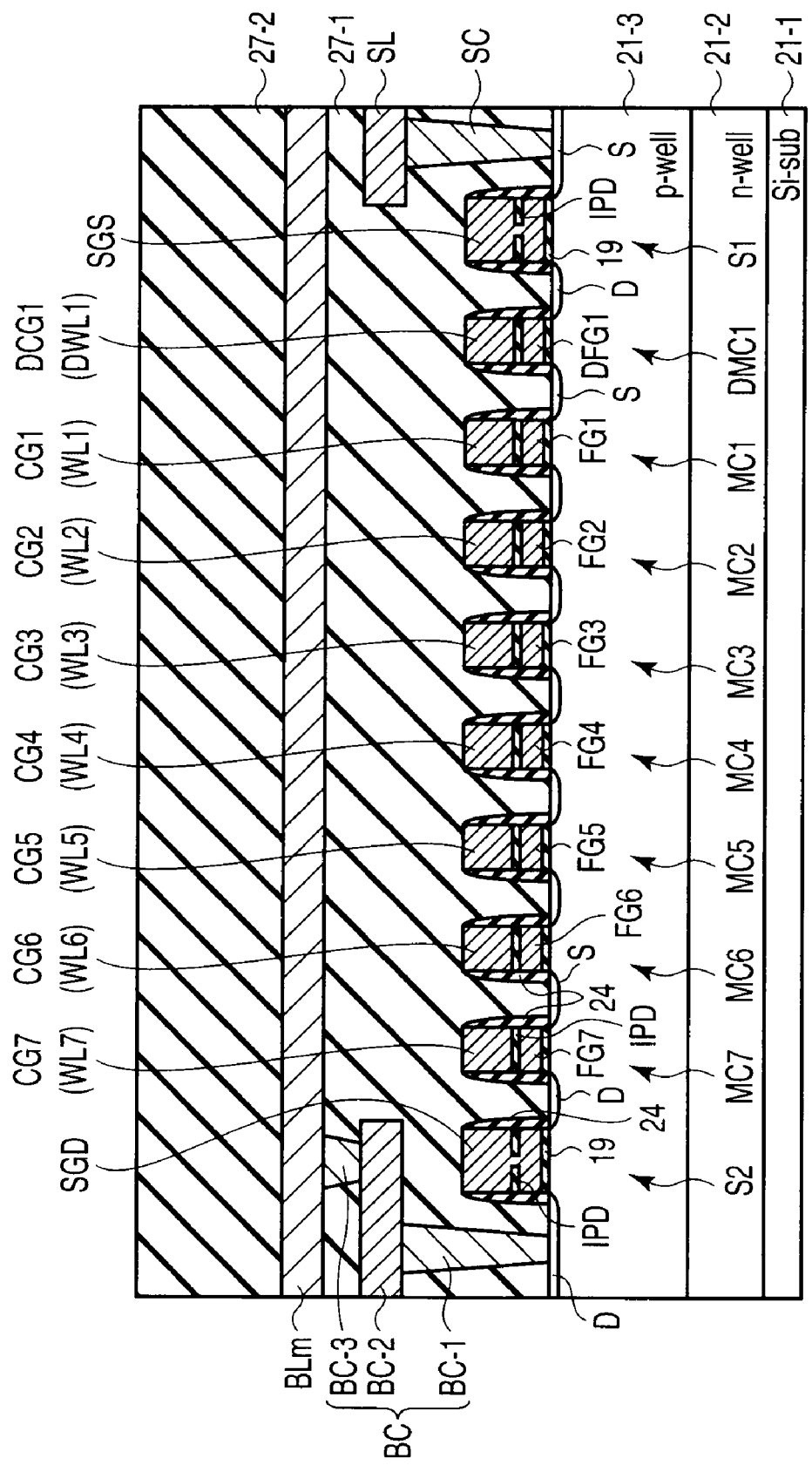
FIG. 6 is a cross-sectional view, taken in a bit line direction, for describing the semiconductor memory device according to the first embodiment.

Next, an example of the cross-sectional structure in the bit line direction is described with reference to FIG. 6. FIG. 6 is a cross-sectional view taken along the bit line direction. In the description below, the cross-sectional structure of the memory cell string 23 on the bit line BLm in FIG. 4 is exemplified.

The memory cells MC1 to MC7 are provided at intersections between the bit line BLm and the word lines WL1 to WL7. Each of the memory cells MC1 to MC7 has a multi-layer structure comprising a gate insulation film 19 which is provided on a P-well 21-3 that is formed in a semiconductor substrate (Si-sub) 21-1; a floating electrode, FG1 to FG7, which is provided on the gate insulation film 19; an inter-gate insulation film IPD which is provided on the floating electrode, FG1 to FG7; and a control electrode, CG1 (WL1) to CG7 (WL7), which is provided on the inter-gate insulation film IPD. Each of the memory cells MC1 to MC7 has spacers 24 which are provided along side walls of the above-described multi-layer structure. The source S/drain D, which is the current path of the memory cell, MC1 to MC7, is connected in series to the source S/drain D of the neighboring memory cell, MC1 to MC7.

The first dummy cell DMC1 has the same multi-layer structure as the memory cells MC1 to MC 7. Specifically, the first dummy cell DMC1 has a multi-layer structure comprising a gate insulation film 19 which is provided on the P-well 21-3; a floating electrode DFG1 which is provided on the gate insulation film 19; an inter-gate insulation film IPD which is provided on the floating electrode DFG1; and a control electrode DCG1 (first dummy word line DWL1) which is provided on the inter-gate insulation film IPD.

The first select transistor S1 includes a gate insulation film 19, an inter-gate insulation film IPD, and a gate electrode (select gate) SGS. The inter-gate insulation film IPD of the select transistor S1 is split at its central part, and the upper and lower layers of the inter-gate insulation film IPD are configured to be electrically connected. The gate electrode SGS is formed of, for instance, a polysilicon layer and a silicide layer which is provided on the polysilicon layer. The first select transistor S1 similarly includes spacers 24 which are provided along side walls of the gate electrode SGS, and a source S and a drain D which are provided in the P-well 21-3 so as to sandwich the gate electrode SGS. The drain of the first select transistor S1 is shared with the drain D of the first dummy cell DMC1.

Similarly, the second select transistor S2 includes a gate insulation film 19, an inter-gate insulation film IPD, and a gate electrode (select gate) SGD. The inter-gate insulation film IPD is split at its central part, and the upper and lower layers of the inter-gate insulation film IPD are configured to be electrically connected. The second select transistor S2 similarly includes spacers 24 which are provided along side walls of the gate electrode SGD, and a source S and a drain D which are provided in the P-well 21-3 so as to sandwich the gate electrode SGD. The drain of the second select transistor S2 is shared with the drain D of the memory cell MC7.

The source line SL is electrically connected to the source S of the first select transistor S1 via a source line contact SC in an interlayer insulation film 27-1.

The bit line BLm is electrically connected to the drain D of the second select transistor S2 via bit line contacts BC-1, BC-2 and BC-3 in the interlayer insulation film 27-1.

<5-1. Structure Example of Word Line Control Circuit>

Next, a structure example of the word line control circuit 16 is described with reference to FIG. 7 and FIG. 8.

Figure 7:
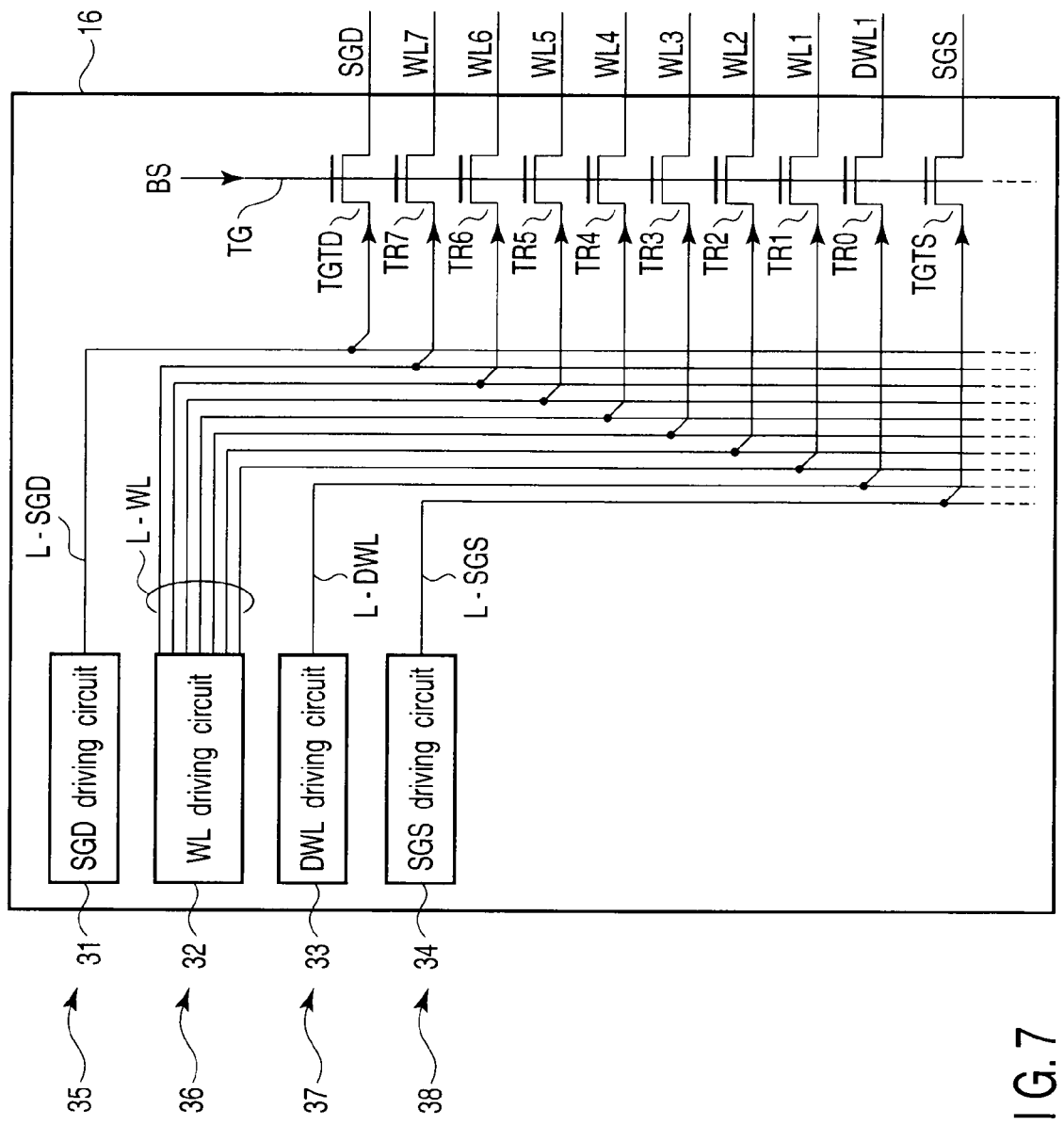
FIG. 7 is a circuit diagram showing a structure example of a word line control circuit according to the first embodiment.

As shown in FIG. 7, the word line control circuit 16 according to this embodiment includes transfer transistors TGTD, TGTS and TR0 to TR7, an SGD driving circuit 31, a WL driving circuit 32, a DWL driving circuit 33 and an SGS driving circuit 34.

The transfer transistors TGTD, TGTS and TR0 to TR7 are high-breakdown-voltage transistors having gates commonly connected to a transfer gate line TG. A block select signal BS, which selects any one of the blocks, is input to the transfer gate line TG.

One end of the current path of the transfer transistor TGTD is connected to the select gate SGD, and the other end of the current path thereof is connected to the SGD driving circuit 31 via a wiring line L-SGD. The transfer transistor TGTD, the wiring line L-SGD and the SGD driving circuit 31 constitute a select gate voltage generating circuit 35.

One end of the current path of the transfer transistor, TR1 to TR7, is connected to the word line, WL1 to WL7, and the other end of the current path thereof is connected to the WL driving circuit 32 via a wiring line L-WL. The transfer transistors TR1 to TR7, the wiring line L-WL and the WL driving circuit 32 constitute a word line voltage generating circuit 36.

One end of the current path of the transfer transistor TR0 is connected to the first dummy word line DWL1, and the other end of the current path thereof is connected to the DWL driving circuit 33 via a wiring line L-DWL. The transfer transistor TR0, the wiring line L-DWL and the DWL driving circuit 33 constitute a dummy word line voltage generating circuit 37.

One end of the current path of the transfer transistor TGTS is connected to the select gate SGS, and the other end of the current path thereof is connected to the SGS driving circuit 34 via a wiring line L-SGS. The transfer transistor TGTS, the wiring line L-SGS and the SGS driving circuit 34 constitute a select gate voltage generating circuit 38.

As described above, by independently providing the word line voltage generating circuit 36 and dummy word line voltage generating circuit 37, it becomes possible to independently control the word lines WL1 to WL7 and the first dummy word line DWL1.

<5-2. Structure Example of WL Driving Circuit and DWL Driving Circuit>

Next, structure examples of the WL driving circuit 32 and DWL driving circuit 33 are described in greater detail with reference to FIG. 8.

Figure 8:
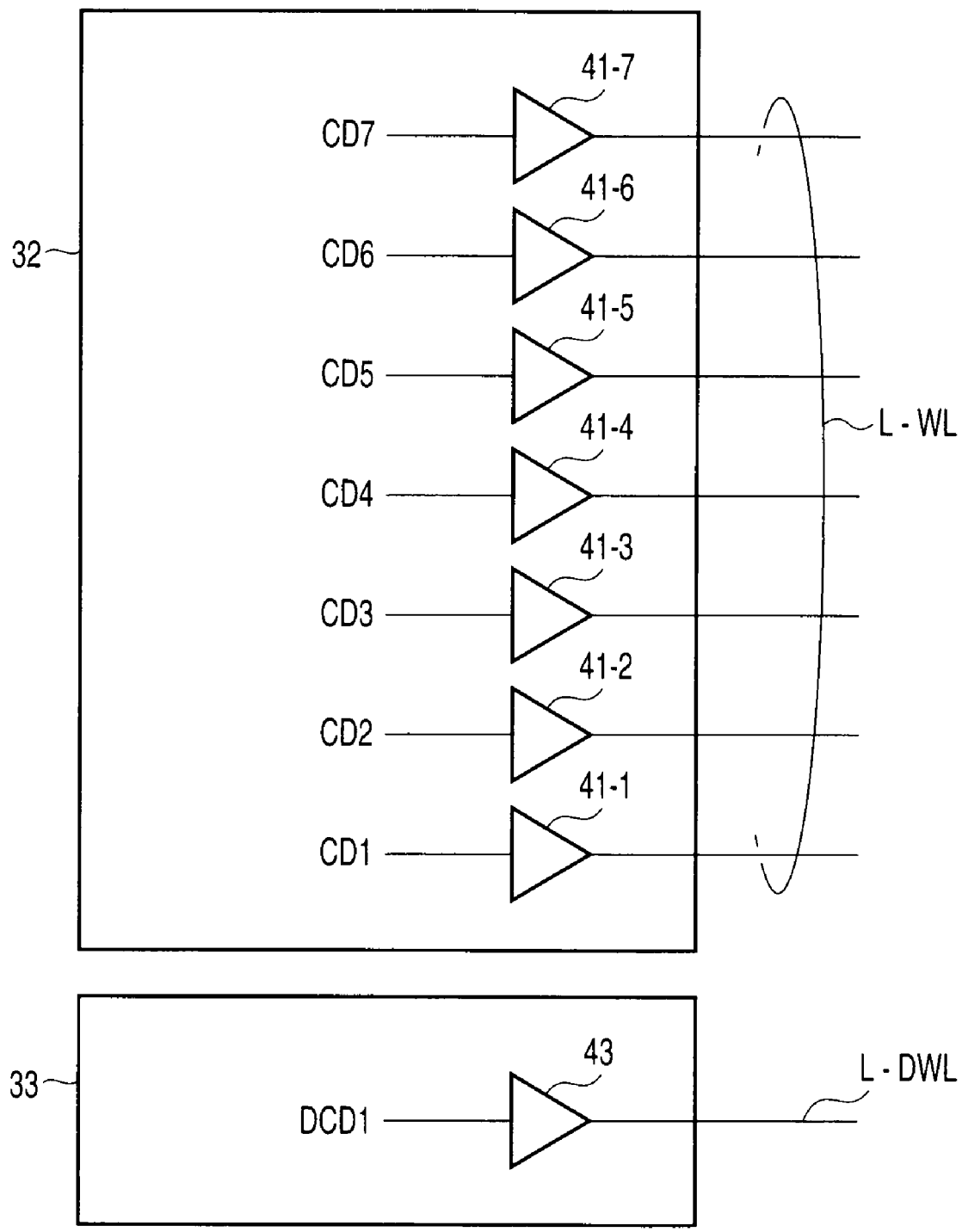
FIG. 8 is a circuit diagram showing structure examples of a WL driving circuit and a DWL driving circuit according to the first embodiment.

As shown in FIG. 8, the WL driving circuit 32 is composed of buffers 41-1 to 41-7. Cell driving signals CD1 to CD7 are input to the input terminals of the buffers 41-1 to 41-7, and the wiring lines L-WL are connected to the output terminals of the buffers 41-1 to 41-7.

The DWL driving circuit 33 is composed of a buffer 43. A dummy cell driving signal DCD1 is input to the input terminal of the buffer 43, and the wiring line L-DWL is connected to the output terminal of the buffer 43.

6. Data Write Operation

Next, a data write operation of the semiconductor memory device according to the present embodiment is described. The data write operation is executed in units of a page. In the description below, the case of writing data in the page 25 corresponding to the word line WL7, which is indicated by a broken line in FIG. 4, is exemplified.

To start with, the word line control circuit 16 applies a write pass voltage Vpass to the non-selected word lines WL1 to WL6 and first dummy word line DWL1, and renders the current paths of the memory cell strings 23 conductive.

Then, the word line control circuit 16 applies a write voltage Vpgm to the selected word line WL7.

Subsequently, the bit line control circuit 12 applies a low voltage to a selected bit line among BL1 to BLm, and injects electrons in the floating electrode FG7 of the write cell MC7 which is connected to the selected bit line among BL1 to BLm. Thereby, data write is executed ("0" write).

7. Data Read Operation

Next, a data read operation of the semiconductor memory device according to the present embodiment is described. The data read operation is executed in units of a page. In the description below, the case of reading data out of the page 25 corresponding to the word line WL7, which is indicated by a broken line in FIG. 4, is exemplified.

To start with, the bit line control circuit 12 applies a predetermined voltage to the bit lines BL1 to BLm, thereby charging the bit lines BL1 to BLm.

Then, the word line control circuit 16 applies a read pass voltage Vread to the non-selected word lines WL1 to WL6 and first dummy word line DWL1, and renders the current paths of the memory cell strings 23 conductive.

Subsequently, the word line control circuit 16 applies a determination threshold voltage to the selected word line WL7.

Thereafter, cell currents of the current paths of the plural selected memory cells MC7, which are connected to the selected word line WL7, are discharged to the bit lines BL1 to BLm. Data read determination is executed according to whether the voltage, which is discharged to the bit line, BL1 to BLm, exceeds a predetermined determination voltage Vsense or not. The data read determination of the discharge voltage is executed by sense amplifiers which are provided in the bit line control circuit 12 and are connected to the bit lines BL1 to BLm, respectively.

As has been described above, the threshold voltage Vth-DMC1 of the first dummy cell DMC1 is higher than the neutral threshold voltage. In other words, this means that carriers (electrons) remain in the floating electrode of the first dummy cell DMC1.

Figure 9A:
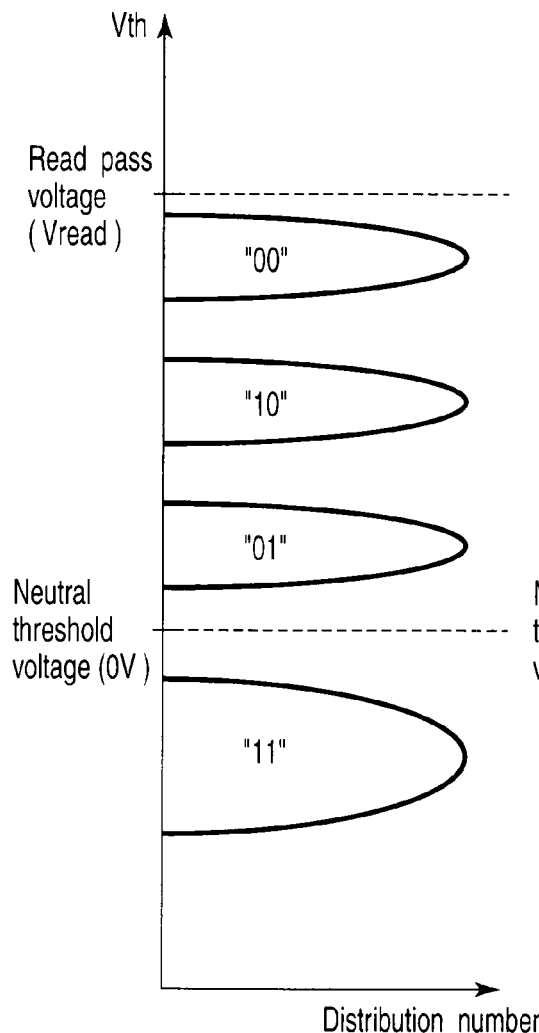
FIG. 9A is a threshold distribution diagram for describing the semiconductor memory device according to the first embodiment at a time of a read operation, and shows threshold distributions of memory cells.
Figure 9B:
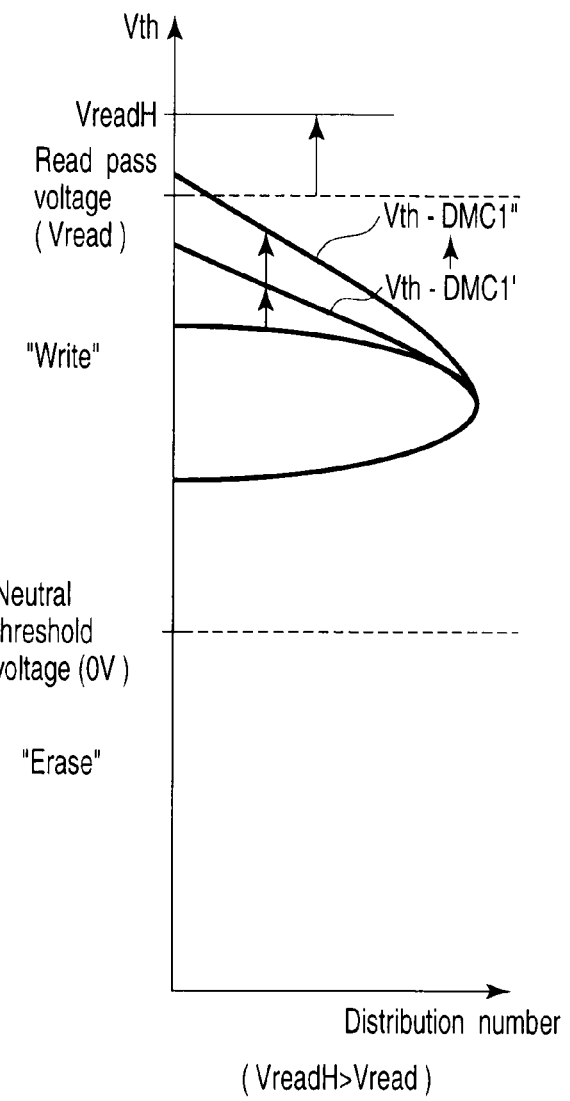
FIG. 9B is a threshold distribution diagram for describing the semiconductor memory device according to the first embodiment at a time of a read operation, and shows a threshold distribution of a first dummy cell.

As illustrated in FIG. 9B, there is a case in which the threshold voltage of the first dummy cell DMC1 varies in a manner to increase (threshold voltage: Vth-DMC1'→Vth-DMC1") as data write/read/erase operations are repeated. In particular, in a case where the threshold voltage of the first dummy cell DMC1, like threshold voltage Vth-DMC1", becomes higher than the memory cell read pass voltage Vread, the first dummy cell DMC1 cannot be turned on, and the current paths of the memory cell strings 23 cannot be rendered conductive. Consequently, the data read operation cannot be executed.

Thus, in the case where the threshold voltage of the first dummy cell DMC1 becomes higher than the memory cell read pass voltage Vread, the dummy word line voltage generating circuit 37 in the word line control circuit 16 executes control to apply a read pass voltage VreadH (>Vread), which is higher than the memory cell read pass voltage Vread, to the first dummy word line DMC1 at the time of the data read operation.

By this control, the first dummy cell DMC1 can be turned on, even in the case where the threshold voltage of the first dummy cell DMC1 becomes higher than the read pass voltage Vread (e.g. in the case of threshold voltage Vth-DMC1") owing to the repeated write/read/erase. As a result, the current paths of the memory cell strings 23 can be conductive, and a predetermined read operation can be executed.

8. Data Erase Operation

Figure 10:
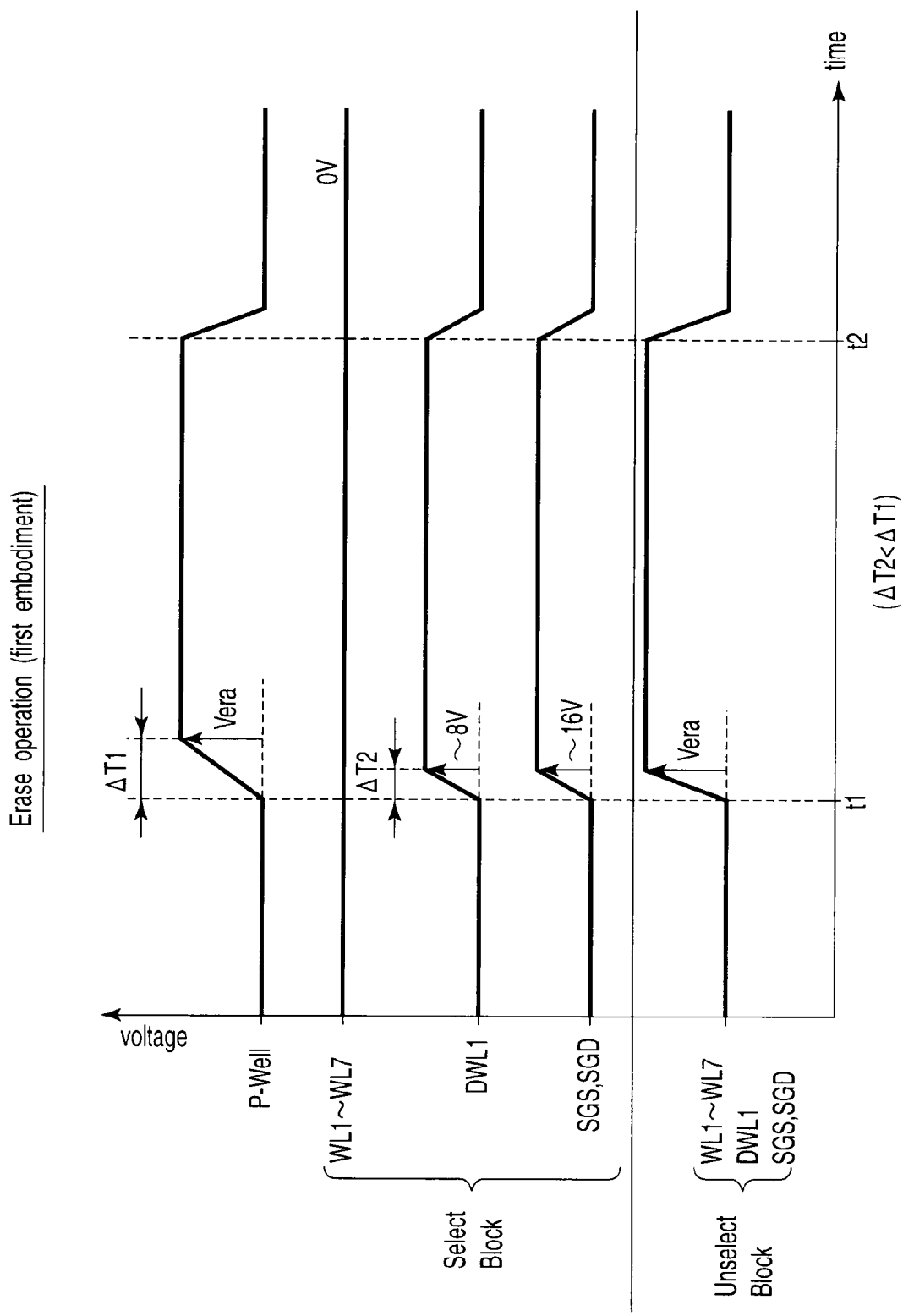
FIG. 10 is a timing chart for describing a data erase operation of the semiconductor memory device according to the first embodiment.

Next, a data erase operation of the semiconductor memory device according to the present embodiment is described with reference to FIG. 10 and FIG. 11. The data erase operation is executed in units of a block. In the description below, the case of erasing the block BLOCK1 shown in FIG. 4 (BLOCK1: Select Block), is exemplified. The description is given with reference to a timing chart of FIG. 10.

At time point t1, an erase voltage Vera is applied to the P-well 21-3. A time, which is needed until the voltage of the P-well 21-3 rises to the erase voltage Vera, is about ΔT1. In the case of this example, the erase voltage Vera is about 20V, and the voltage rising time ΔT1 is about several-hundred μsec.

In the selected block BLOCK1 (Select Block), at time point t1, 0V is applied to the word lines WL1 to WL7 by the control of the word line voltage generating circuit 36.

At time point t1, by the control of the dummy word line voltage generating circuit 37, a voltage, which has a value between the voltage applied to the control electrodes of the memory cells (0V that is applied to the word lines WL1 to WL7) and the erase voltage Vera applied to the well (P-well 21-4), is applied to the first dummy word line DWL1. Specifically, control is executed to set the threshold voltage Vth-DMC1 of the first dummy cell DMC1 to be higher, at least, than the neutral threshold voltage. In other words, the first dummy cell DMC1 is not completely erased, and carriers (electrons) are left in the floating electrode DFG1 of the first dummy cell DMC1.

The threshold voltage Vth-DMC1 may be preset at the time of shipment, or may be written after shipment. In the case of writing the threshold voltage Vth-DMC1 after shipment, an ordinary write operation may be executed in the first dummy cell before first data is written in the memory cell. As a result, at the time of shipment, the threshold voltage Vth-DMC1 is not written in the first dummy cell, and the first dummy cell has the same threshold voltage as the other memory cells. However, the threshold voltage Vth-DMC1 is written in the first dummy cell before the time when data is written in the memory cell and the erase operation is executed.

In the above context, the phrase "before first data is written in the memory cell" refers to not only the case in which data is first written in the memory cell after shipment. This also means that the threshold voltage Vth-DMC1 may be written in the first dummy cell in a certain block before data is first written in a memory cell in this block.

A voltage rising time ΔT2, which is needed until the voltage of the first dummy word line DWL1 rises to the above-mentioned voltage value, is less than the above-described voltage rising time ΔT1 (ΔT2<ΔT1). In the case of this example, the above-mentioned voltage value is 8V, and the voltage rising time ΔT2 is about several μsec.

At time point t1, a voltage, which corresponds to a difference (Vera–gate dielectric breakdown voltage) between the erase voltage Vera and the gate dielectric breakdown voltage of the first and second select transistors S1 and S2, is applied to the select gate SGS, SGD, by capacitive coupling with the P-well 21-3. In the case of this example, a voltage of about 16V (Vera–gate dielectric breakdown voltage: approximately, 20V-4V) is applied to the select gate SGS, SGD.

On the other hand, in the non-selected block (Unselect Block), at time point t1, the erase voltage Vera is applied to all word lines WL1 to WL7, first dummy word line DWL1 and select gates SGS and SGD.

FIG. 11 shows the relationship in voltage in the bit line direction of the selected block BLOCK (Select Block) at time point t1.

As shown in FIG. 11, a voltage (floating voltage), which corresponds to a difference (Vera–gate dielectric breakdown voltage) between the erase voltage Vera and the gate dielectric breakdown voltage of the first and second select transistors S1 and S2, is applied to the select gate SGS, SGD, by capacitive coupling with the P-well 21-3.

At this time, by the control of the dummy word line voltage generating circuit 37, a voltage, which has a value between the voltage applied to the control electrodes of the memory cells (0V that is applied to the word lines WL1 to WL7) and the erase voltage Vera applied to the well (P-well 21-4), is applied to the first dummy word line DWL1. Specifically, control is executed to set the threshold voltage Vth of the first dummy cell DMC1 to be higher, at least, than the neutral threshold voltage. Thus, as shown in FIG. 11, the first dummy cell DMC1 is not completely erased, and carriers are made to remain in the floating electrode DFG1 of the first dummy cell DMC1. By this control, it becomes possible to prevent the select transistor S1 from being damaged by gate dielectric breakdown.

Figure 12:
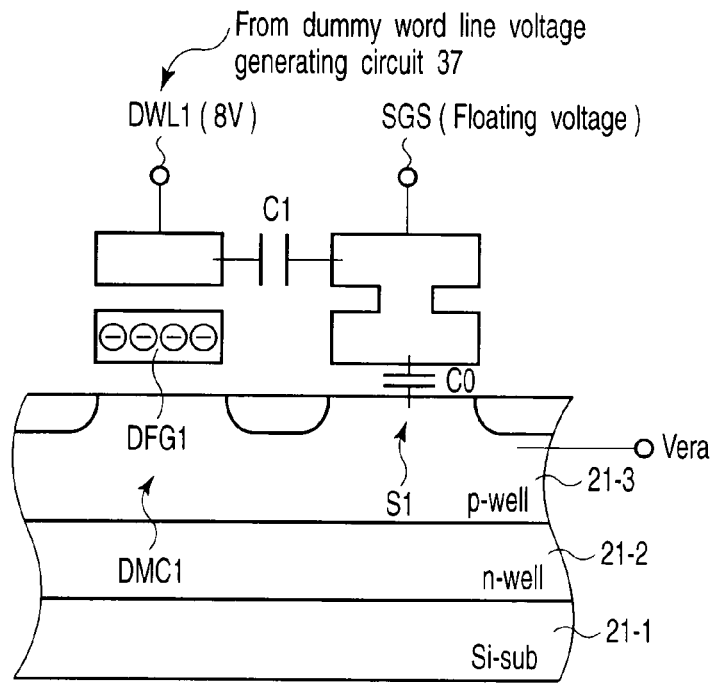
FIG. 12 is a cross-sectional view (CASE 1) for describing the relationship in voltage between the first dummy cell and a first select transistor at a time of an erase operation according to the first embodiment.
Figure 13:
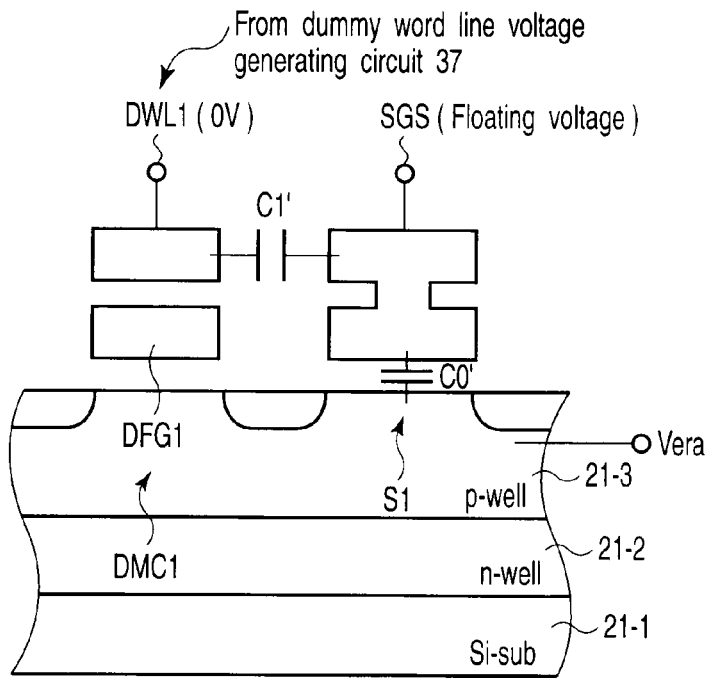
FIG. 13 is a cross-sectional view (CASE 2) for describing the relationship in voltage between the first dummy cell and the first select transistor at a time of an erase operation according to the first embodiment.

The reason for this is explained with reference to FIG. 12 and FIG. 13. FIG. 12 is a cross-sectional view in the bit line, which shows a case CASE1. FIG. 13 is a cross-sectional view in the bit line, which shows a case CASE2.

<CASE1 (8V is Applied to DWL and Electrons are Left in DFG1>

To begin with, CASE1 is described with reference to FIG. 12. In CASE1, a voltage of about 8V is applied to the first dummy word DWL1, and electrons are made to remain in the floating electrode DFG1 of the first dummy cell DMC1. The above-described control is thus executed.

In this case, in the erase operation, the dummy word line voltage generating circuit 37 controls the voltage (about 8V in this example) that is applied to the dummy word line DWL1, thereby to set the threshold voltage Vth of the first dummy cell DMC1 to become higher than the neutral threshold voltage (i.e. carriers (electrons) remain in the floating electrode of the first dummy cell DMC1) even in the case where the gate voltage of the select transistor S1 is increased by the capacitive coupling C0 with the well voltage (Vera) of the P-well 21-3.

Thus, since the capacitive coupling C1 between the first dummy word line DWL1 and the select gate SGS can be reduced, the capacitive coupling C0 with the well voltage (Vera) of the P-well 21-3 can be reduced, and the electric field intensity of the gate voltage of the select transistor S1 can be decreased. In other words, the reason is that the electric field intensity of the gate voltage of the select transistor S1 in the erase operation can be relaxed to some degree by the carriers (electrons) which remain in the floating electrode DFG1 of the first dummy cell DMC1. As described above, in this CASE1, the select transistor S1 can be prevented from being damaged by gate dielectric breakdown.

<CASE2 (0V is Applied to DWL and Electrons are not Left in DFG1>

Next, CASE2 is described with reference to FIG. 13. In CASE2, a voltage of about 0V is applied to the first dummy word DWL1, and electrons are not left in the floating electrode DFG1 of the first dummy cell DMC1. Thus, the above-described control is not executed.

In this case, in the erase operation, the dummy word line voltage generating circuit 37 controls the voltage (about 0V in this example) that is applied to the dummy word line DWL1, thereby to set the threshold voltage Vth of the first dummy cell DMC1 to be lower than the neutral threshold voltage (i.e. carriers (electrons) are not left in the floating electrode of the first dummy cell DMC1).

In CASE2, compared to CASE1, the capacitive coupling C1' between the first dummy word line DWL1 and the select gate SGS increases (capacitive coupling: C1'>C1). Accordingly, the capacitive coupling C0' with the well voltage (Vera) of the P-well 21-3 increases (capacitive coupling: C0'>C0). Thus, the electric field intensity of the gate voltage of the select transistor S1 cannot be reduced. As described above, in this CASE2, the select transistor S1 cannot be prevented from being damaged by gate dielectric breakdown.

In consideration of the above-described CASE1 and CASE2, it may be thought that the voltage, which is applied to the first dummy word line DMC1 at time point t1 by the control of the dummy word line voltage generating circuit 37, may be set to be substantially equal (about 16V in this example) to the voltage that is applied to the select gate SGS.

However, as shown in FIG. 11, it is preferable to also consider the capacitive coupling C2 with the floating electrode FG1 of the memory cell MC1 that neighbors the first dummy cell DMC1. The reason for this is that if the voltage, which is applied to the first dummy word line DMC1 is set to be substantially equal (e.g. about 16V) to the voltage that is applied to the select gate SGS, the capacitive coupling C2 also increases. If the capacitive coupling C2 increases, the voltage of the floating electrode FG1 of the memory cell MC1 rises, leading to a decrease in erase speed of the memory cell MC1.

It is preferable, therefore, that the voltage, which is applied to the first dummy word line DWL1 at time point t1 by the control of the dummy word line voltage generating circuit 37, be a voltage with a value between the voltage applied to the control electrodes of the memory cells (0V that is applied to the word lines WL1 to WL7) and the erase voltage Vera applied to the well (P-well 21-4). More preferably, as in this example, the voltage value should be about a half value between the voltage applied to the control electrodes of the memory cells (0V that is applied to the word lines WL1 to WL7) and the erase voltage Vera applied to the well (P-well 21-4) (in this example, (16V+0V)/2=about 8V).

As has been described above, if both the capacitive couplings C1 and C2 are considered, the voltage, which is applied to the first dummy word line DWL1 at time point t1 by the control of the dummy word line voltage generating circuit 37, should preferably be a voltage with a value between the voltage applied to the control electrodes of the memory cells (0V that is applied to the word lines WL1 to WL7) and the erase voltage Vera applied to the well (P-well 21-4). More preferably, as in this example, the voltage value should be about a half value between the voltage applied to the control electrodes of the memory cells (0V that is applied to the word lines WL1 to WL7) and the erase voltage Vera applied to the well (P-well 21-4) (in this example, (16V+0V)/2=about 8V).

At time point t2, 0V is applied to the P-well 21-3, the word lines WL1 to WL7 of the selected block BLOCK1 and non-selected block, and the first dummy word line DWL1, and the data erase operation is finished.

9. Advantageous Effects of the Embodiment

According to the semiconductor memory device of this embodiment and the data erase method thereof, at least the following advantageous effects (1) and (2) can be obtained.

(1) The defect ratio of memory cells MC1 to MC7 can be reduced, and damage to the select transistor S1 can be prevented.

As has been described above, the semiconductor memory device according to the present embodiment includes the first dummy cell DMC1 which is disposed on the source line SL side such that one end and the other end of the current path thereof are connected between the first select transistor S1 and the memory cell MC.

Thus, even in the case where the electric field between the word line WL and the select gate SGS increases due to microfabrication and hot carriers are excessively injected in the floating electrode of the first dummy cell DMC1 that neighbors the first select transistor S1, the first dummy cell DMC1 can be made to function as a dummy cell. As a result, the plural memory cells MC1 to MC7 of the memory cell string 23 can be protected, and the defect ratio of the memory cells MC1 to MC7 can be decreased.

Figure 14:
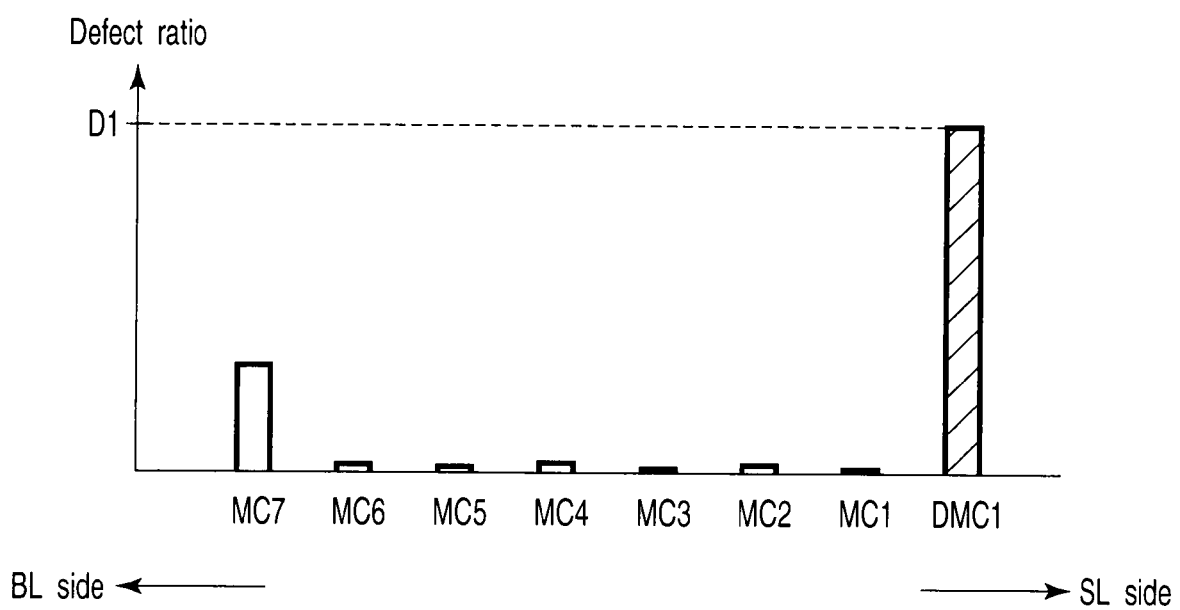
FIG. 14 shows a defect ratio of a memory cell string according to the first embodiment.

For example, the defect ratio of the memory cell string 23 due to hot carriers in this embodiment is as shown in FIG. 14. FIG. 14 is a graph showing the relationship between the memory cells MC1 to MC7 and first dummy cell DMC1 of the memory cell string 23 and the defect ratio due to hot carriers. As shown in FIG. 14, according to the above-described structure, a defect ratio D1 of the first dummy cell DMC1, which is indicated by hatching, can be eliminated. Since the defect ratio D1 indicated by hatching in FIG. 14 can be eliminated, the defect ratio of memory cells MC1 to MC7 in the memory cell string 23 can be reduced.

Further, the threshold voltage Vth-DMC1 of the first dummy cell DMC1 is set to be higher than the neutral threshold voltage (about 0V in this embodiment).

Thus, since the capacitive coupling C1 between the first dummy word line DWL1 and the select gate SGS can be reduced, the capacitive coupling C0 with the well voltage (Vera) of the P-well 21-3 can be reduced, and the electric field intensity of the gate voltage of the select transistor S1 can be decreased. In other words, the electric field intensity of the gate voltage of the select transistor S1 in the erase operation (time point t1) can be relaxed to some degree by the carriers (electrons) which remain in the floating electrode DFG1 of the first dummy cell DMC1. As a result, the select transistor S1 can be prevented from being damaged by gate dielectric breakdown.

(2) Microfabrication can advantageously be achieved.

As described above, since the threshold voltage Vth-DMC1 of the first dummy cell DMC1 is set to be higher than the neutral threshold voltage (about 0V in this embodiment), the electric field intensity of the gate voltage of the select transistor S1 in the erase operation (time point t1) can be relaxed to some degree by the carriers (electrons) which remain in the floating electrode DFG1 of the first dummy cell DMC1.

Therefore, microfabrication can advantageously be achieved in that the structure of the select transistor S1 can be made finer to a degree beyond the limit of the gate breakdown voltage of the select transistor S1.

[Modification (an Example in which the Timing of Raising the Voltage of the First Dummy Word Line is Controlled and Made Earlier)]

Next, a semiconductor memory device according to a modification and a data erase method thereof are described with reference to FIG. 15 to FIG. 17. This modification relates to an example in which in the data erase operation, the timing of raising the voltage of the first dummy word line DWL1 is controlled and made earlier than the timing of applying the voltage to the P-well 21-3 in which the memory cell is disposed. A detailed description of the parts common to those in the above-described first embodiment is omitted here. The description is given with reference to a flow chart of FIG. 15.

Figure 15:
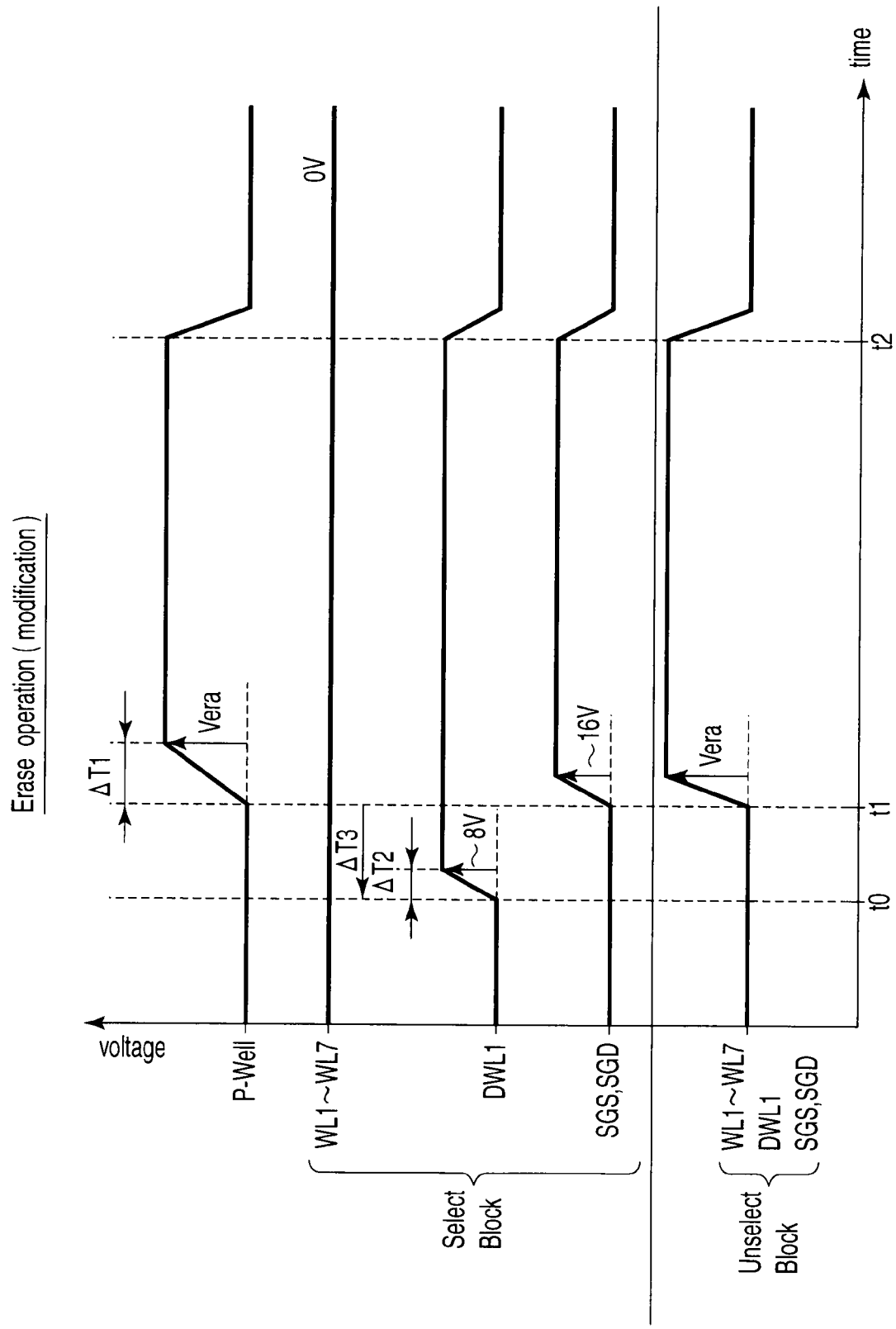
FIG. 15 is a timing chart illustrating an erase operation of a semiconductor memory device according to a modification.

As illustrated in FIG. 15, the present modification differs from the first embodiment in that the dummy word line voltage generating circuit 37 executes control to set the timing of raising the voltage of the first dummy word line DWL1 to become earlier, by ΔT3, than the timing (time point t1) of applying the erase voltage Vera to the P-well 21-3. In this example, the time ΔT3 is, e.g. about several-ten μsec.

By this control, device degradation of the transfer transistor TR0 in the word line control circuit 16 due to hot carriers can advantageously be prevented. The reason for this is explained below with reference to FIG. 16A, FIG. 16B, FIG. 17A and FIG. 17B.

<CASE1 (the Voltage of the P-Well is Raised Earlier)>

Figure 16A:
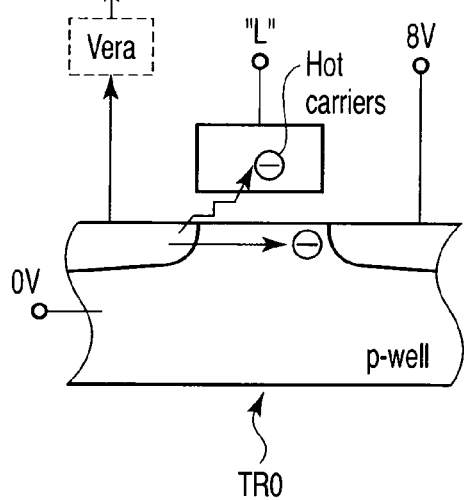
FIG. 16A is a view for explaining a case in which the voltage of a P-well according to the modification is raised to an erase voltage, earlier than a transfer transistor.
Figure 16B:
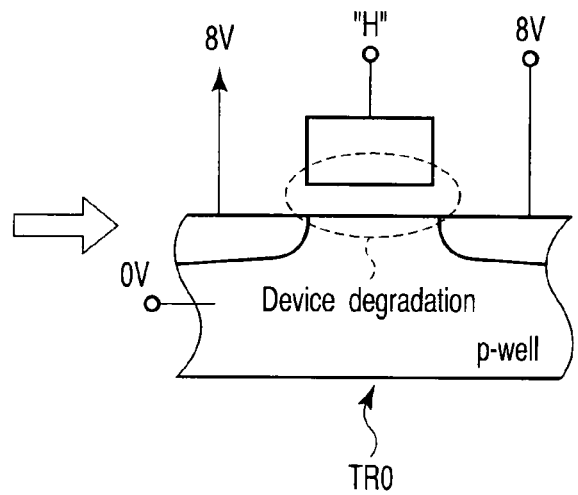
FIG. 16B is a view for explaining a case in which the voltage of the P-well according to the modification is raised to an erase voltage, earlier than the transfer transistor.

To begin with, referring to FIG. 16A and FIG. 16B, a description is given of the case in which the voltage of the P-well 21-3, in which the memory cell is disposed, is raised earlier. FIG. 16A and FIG. 16B are views for explaining the case in which the voltage of the P-well 21-3, in which the memory cell is disposed, is raised to the erase voltage Vera earlier than the transfer transistor TR0. In this example, the transfer transistor TR0, which is shown, and the memory cell and dummy memory cell are disposed at different positions on the well.

FIG. 16A shows the relationship in voltage. As shown in FIG. 16A, the erase voltage Vera is applied to the P-well 21-3, in which the memory cell is disposed, before the transfer transistor TR0 is turned on. Accordingly, the source of the transfer transistor TR0 is raised to a level which approximately corresponds to the erase voltage Vera. Thus, part of off-leakage current or GIDL, which have occurred before the transfer transistor TR0 is turned on, causes damage to the gate insulation film of the transfer transistor TR0.

Consequently, as shown in FIG. 16B, when the transfer transistor is subsequently turned on, device degradation of the transfer transistor TR0 occurs.

<CASE2 (the Voltage of the Transfer Transistor is Raised Earlier)>

Figure 17A:
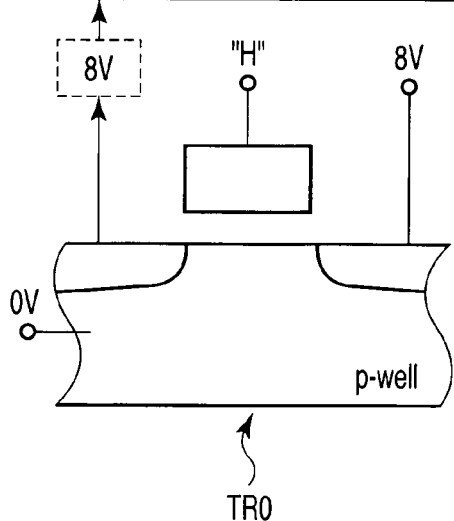
FIG. 17A is a view for explaining a case in which the voltage of the transfer gate according to the modification is raised, earlier than the P-well.
Figure 17B:
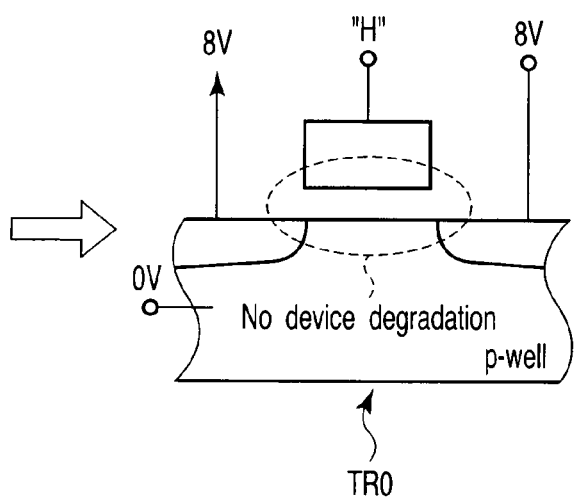
FIG. 17B is a view for explaining a case in which the voltage of the transfer gate according to the modification is raised, earlier than the P-well.

Next, referring to FIG. 17A and FIG. 17B, a description is given of the case in which the voltage of the transfer transistor TR0 is raised earlier. FIG. 17A and FIG. 17B are views for explaining the case in which the voltage of the transfer transistor TR0 is raised (by about 8V) earlier than the P-well 21-3 in which the memory cell is disposed.

In this case, the control according to the present modification is executed, and FIG. 17A shows the relationship in voltage at time point t0.

As shown in FIG. 17A, before the erase voltage Vera is applied to the P-well 21-3 in which the memory cell is disposed, a voltage of about 8V is applied to the source of the transfer transistor TR0, and the transfer transistor TR0 is turned on.

Subsequently, as shown in FIG. 17B, even if the erase voltage Vera is applied to the P-well 21-3 at time point t1, the capacitive coupling with the P-well 21-3 can be reduced since the voltage of about 8V is applied to the source of the transfer transistor TR0. Thus, off-leakage current or GIDL is reduced, and device degradation of the transfer transistor TR0 can be prevented.

According to the semiconductor memory device of this modification and the data erase method thereof, at least the same advantageous effects (1) and (2) as described above can be obtained. Furthermore, according to this modification, at least the following advantageous effect (3) can be obtained.

(3) Device degradation of the transfer transistor TR0 can advantageously be prevented.

In the semiconductor memory device according to the present modification, the dummy word line voltage generating circuit 37 executes control at time point t0 to set the timing of raising the voltage of the first dummy word line DWL1 to become earlier, by ΔT3, than the timing (time point t1) of applying the erase voltage Vera to the P-well 21-3 in which the memory cell is disposed.

Thus, device degradation of the transfer transistor TR0 can advantageously be prevented in that part of off-leakage current or GIDL is prevented from causing damage to the gate insulation film of the transfer transistor TR0.

Moreover, since the first dummy cell DMC1 is connected to the transfer transistor TR0, no erroneous write occurs.

Second Embodiment

An Example in which a Second Dummy Cell is Further Included

Next, a semiconductor memory device according to a second embodiment of the invention and a data erase method thereof are described with reference to FIG. 18 to FIG. 21. This embodiment relates to an example in which a second dummy cell DMC2 is further included. A detailed description of the parts common to those in the first embodiment is omitted here.

Figure 18:
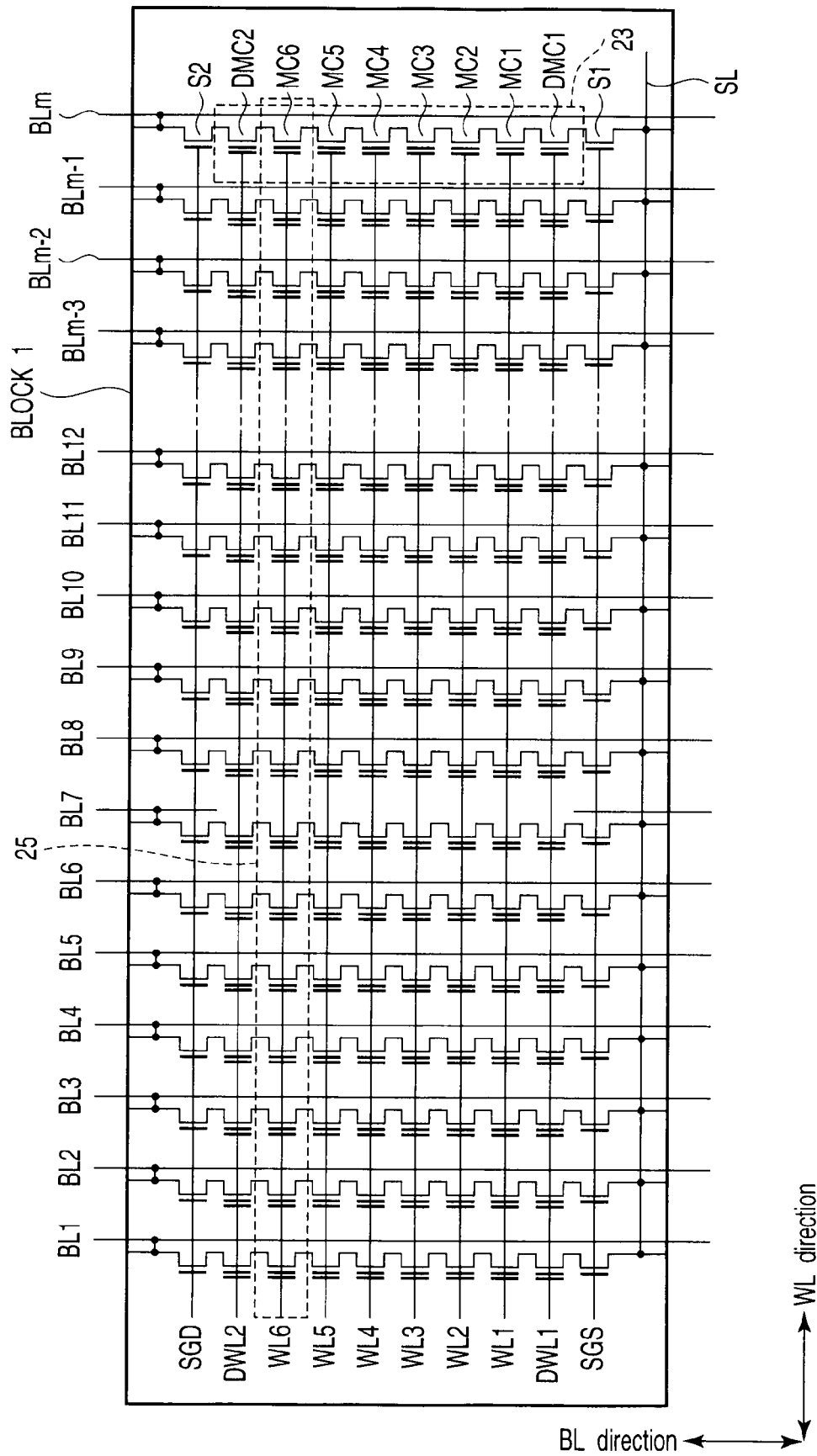
FIG. 18 is a circuit diagram showing one block of a semiconductor memory device according to a second embodiment of the invention.

As shown in FIG. 18 and FIG. 19, the second embodiment differs from the first embodiment in that in the semiconductor memory device of the second embodiment, the memory cell string 23 further includes the second dummy cell DMC2 which is disposed on the bit line BL side such that one end and the other end of the current path thereof are connected between the second select transistor S2 and the memory cell MC6.

Since the second dummy cell DMC2 is made to function as a dummy cell, it becomes possible to protect the memory cells MC1 to MC6 from not only the hot carries occurring on the source line SL side, but also the hot carriers occurring on the bit line BL side. As a result, the plural memory cells MC1 to MC6 of the memory cell string 23, which are disposed between the first and second dummy cells DMC1 and DMC2, can be protected, and the defect ratio of the memory cells MC1 to MC6 can advantageously be further reduced.

Although not shown, like the threshold voltage of the first dummy cell DMC1, the threshold voltage of the second dummy cell DMC2 is configured to become higher than the neutral threshold voltage (about 0V in this example). A second dummy word line DWL2 is electrically connected to the dummy word line voltage generating circuit 37.

<Data Write Operation>

Figure 20:
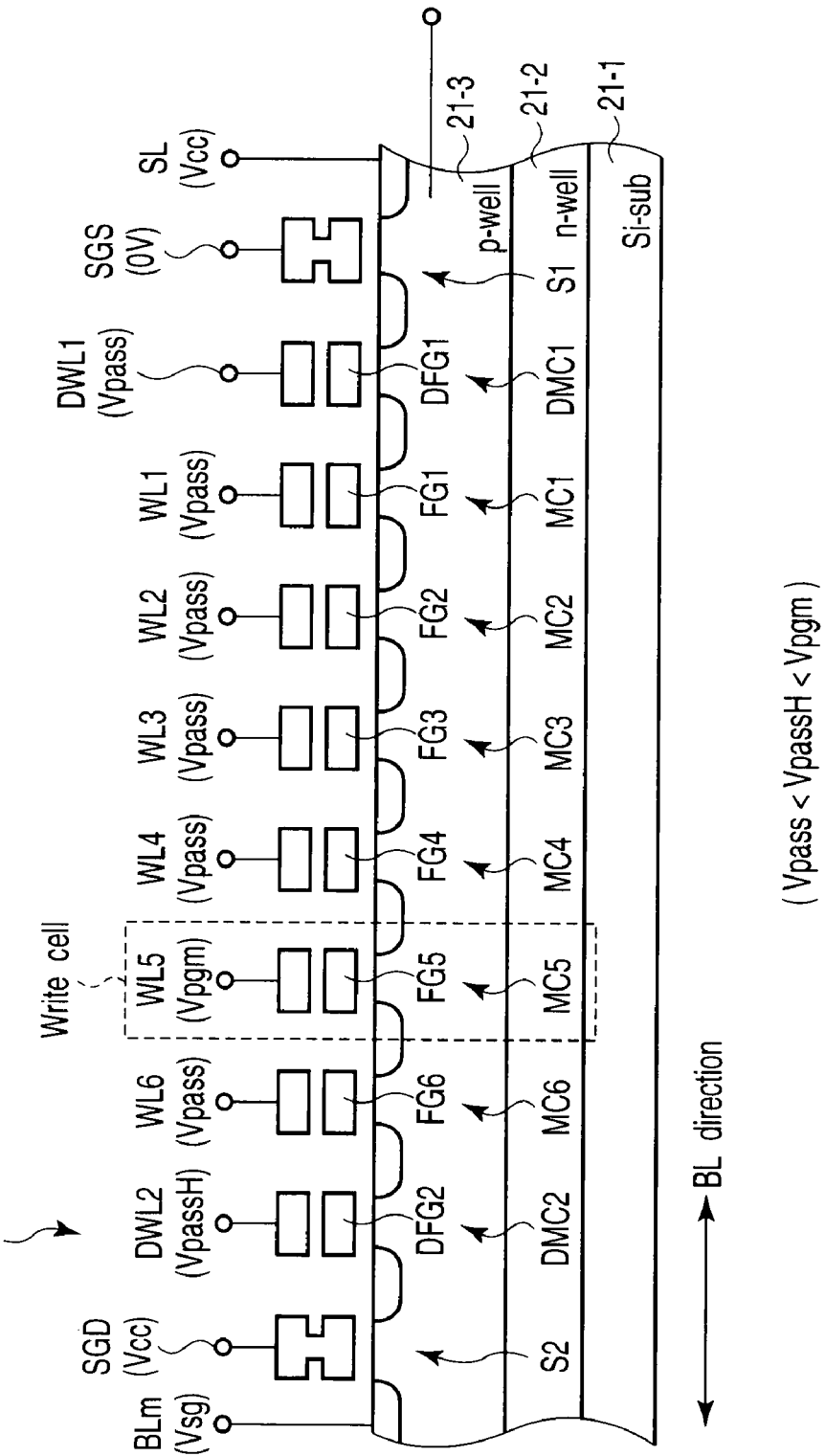
FIG. 20 is a cross-sectional view for describing the erase operation of the semiconductor memory device according to the second embodiment.

Next, a data write operation of the semiconductor memory device according to the present embodiment is described with reference to FIG. 20. FIG. 20 is a cross-sectional view, taken in the bit line direction, for explaining the data write operation of this embodiment. In the description below, the case of writing data in the memory cell MC 5 by injecting carriers in the floating electrode FG5 of the memory cell MC5, which is indicated by a broken line in FIG. 20, is exemplified.

FIG. 20 shows the relationship in voltage at the time of the data write operation in this embodiment. As shown in FIG. 20, the second embodiment differs from the first embodiment in that the dummy word line voltage generating circuit 37 executes control to apply, at the time of the data write operation, a write pass voltage VpassH, which has a value between the write pass voltage Vpass of the memory cell and the write voltage Vpgm, to the control electrode DCG2 (DWL2) of the second dummy cell. Specifically, the voltage value of the write pass voltage VpassH, which is applied to the second dummy word line DWL2 (control electrode DCG2) of the second dummy cell at the time of the data write operation, is higher than the write pass voltage Vpass which is applied to the word lines WL1 to WL6 and first dummy word line DWL1, and is lower than the write voltage Vpgm (Vpass<VpassH<Vpgm).

By the above-described control, even in the case where the threshold voltage of the second dummy cell DMC2 is the neutral threshold voltage that is higher than the threshold voltage of the memory cells MC1 to MC6, the current path of the second dummy cell DMC2 can surely be rendered conductive at the time of the write operation, and a desired write operation can be executed.

As has been described above, according to the semiconductor memory device of this embodiment and the data erase method thereof, at least the same advantageous effects (1) and (2) as described above can be obtained.

Furthermore, according to the present embodiment, at least the following advantageous effects (4) and (5) can be obtained.

(4) The defect ratio of memory cells MC1 to MC6 can further be reduced.

In the semiconductor memory device of the second embodiment, the memory cell string 23 further includes the second dummy cell DMC2 which is disposed on the bit line BL side such that one end and the other end of the current path thereof are connected between the second select transistor S2 and the memory cell MC6.

Since the second dummy cell DMC2 is made to function as a dummy cell, it becomes possible to protect the memory cells MC1 to MC6 from not only the hot carriers occurring on the source line SL side, but also the hot carriers occurring on the bit line BL side. As a result, the plural memory cells MC1 to MC6 of the memory cell string 23, which are disposed between the first and second dummy cells DMC1 and DMC2, can be protected, and the defect ratio of the memory cells MC1 to MC6 can advantageously be further reduced.

Figure 21:
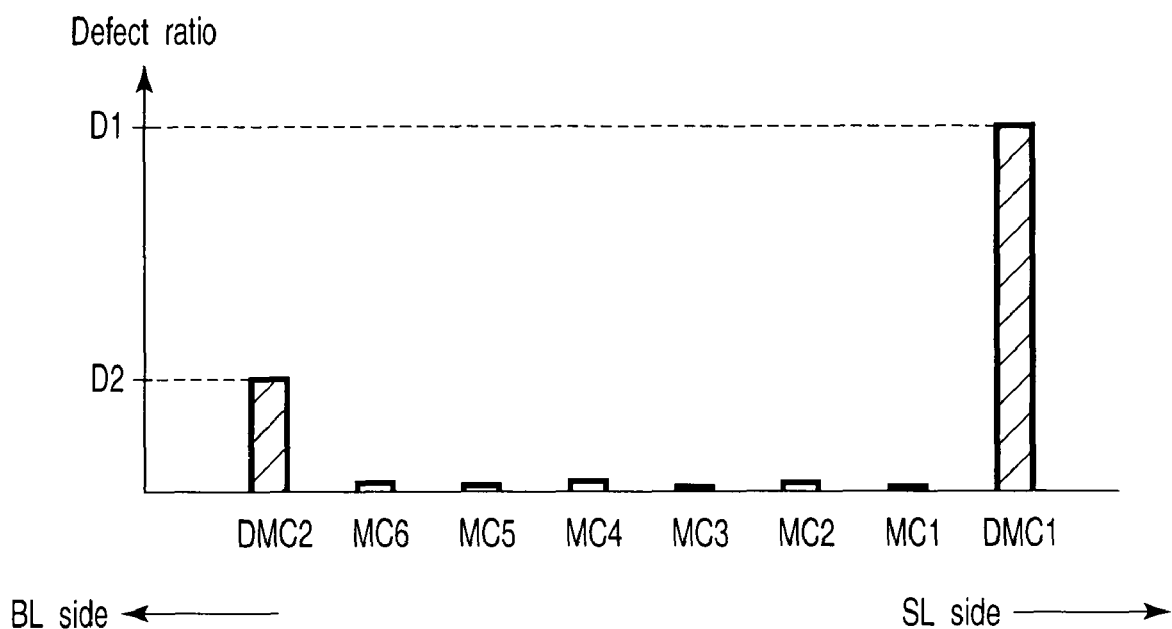
FIG. 21 shows a defect ratio of a memory cell string according to the second embodiment.

For example, the defect ratio of the memory cell string 23 due to hot carriers in this embodiment is as shown in FIG. 21. FIG. 21 is a graph showing the relationship between the memory cells MC1 to MC6 and first and second dummy cells DMC1 and DMC2 of the memory cell string 23 and the defect ratio due to hot carriers. As shown in FIG. 21, according to the above-described structure, since the first and second dummy cells DMC1 and DMC2 can be made to function as dummy cells, not only the defect ratio D1 indicated by hatching in FIG. 21, but also the defect ratio D2 can be eliminated. Since the defect ratio D1 and defect ratio D2 indicated by hatching in FIG. 21 can be eliminated, the defect ratio of memory cells MC1 to MC6 in the memory cell string 23 can further be reduced.

As is clear from FIG. 21, since the defect ratio of the memory cells MC1 to MC6 is substantially zero, the defect ratio of the memory cell string 23 can be reduced to substantially 0% in the present embodiment.

(5) At the time of the write operation, the current path of the second dummy cell DMC2 can surely be rendered conductive.

As has been described above, the dummy word line voltage generating circuit 37 executes control to apply, at the time of the data write operation, the write pass voltage VpassH, which has a value between the write pass voltage Vpass and the write voltage Vpgm, to the control electrode DCG2 (DWL2) of the second dummy cell. Specifically, the voltage value of the write pass voltage VpassH, which is applied to the second dummy word line DWL2 (control electrode DCG2) of the second dummy cell at the time of the data write operation, is higher than the write pass voltage Vpass which is applied to the word lines WL1 to WL6 and first dummy word line DWL1, and is lower than the write voltage Vpgm (Vpass<VpassH<Vpgm).

By the above-described control, even in the case where the threshold voltage of the second dummy cell DMC2 is the neutral threshold voltage that is higher than the threshold voltage of the memory cells MC1 to MC6, the current path of the second dummy cell DMC2 can surely be rendered conductive at the time of the write operation, and a desired write operation can advantageously be executed.

In the above-described first and second embodiments and modification, a multilevel NAND flash memory, which can store multi-bit data in one memory cell, has been exemplified. The invention, however, is not limited to this. The invention is similarly applicable to a single-level NAND flash memory which can store 2-bit data in one memory cell, and the same advantageous effects can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a memory cell array which includes a plurality of memory cell strings each including a plurality of memory cells and a first dummy cell, which have current paths connected in series at one end and the other end thereof, a plurality of first select transistors each having a current path with one end connected to one end of a current path of an associated one of the memory cell strings, and a plurality of second select transistors each having a current path with one end connected to the other end of the current path of an associated one of the memory cell strings;
a source line which is electrically connected to the other end of the current path of an associated one of the first select transistors; and
a bit line which is electrically connected to the other end of the current path of an associated one of the second select transistors,
wherein the first dummy cell is disposed on the source line side such that one end and the other end of the current path thereof are connected between the first select transistor and the memory cell, and a threshold voltage of the first dummy cell is higher than a neutral threshold voltage.

2. The device according to claim 1, further comprising a dummy word line voltage generating circuit which executes control to apply a read pass voltage, which is higher than a read pass voltage of the memory cell, to a control electrode of the first dummy cell.

3. The device according to claim 2, wherein at a time of an erase operation the dummy word line voltage generating circuit applies, to the control electrode of the first dummy cell, a voltage that is between a voltage, which is applied to a control electrode of the memory cell, and an erase voltage which is applied to a well.

4. The device according to claim 3, wherein a value of the voltage, which is applied to the first dummy cell by the dummy word line voltage generating circuit, is a half value between the voltage, which is applied to the control electrode of the memory cell, and the erase voltage.

5. The device according to claim 2, wherein at a time of an erase operation the dummy word line voltage generating circuit applies an erase voltage to a dummy word line of a non-selected block.

6. The device according to claim 2, wherein at a time of an erase operation the dummy word line voltage generating circuit executes control to set a timing of applying the voltage to the control electrode of the first dummy cell to become earlier than a timing of applying the erase voltage.

7. The device according to claim 1, wherein the threshold voltage of the first dummy cell is set before data write in the memory cell.

8. A semiconductor memory device comprising:
a memory cell array which includes a plurality of memory cell strings each including a plurality of memory cells, a first dummy cell and a second dummy cell, which have current paths connected in series at one end and the other end thereof, a plurality of first select transistors each having a current path with one end connected to one end of a current path of an associated one of the memory cell strings, and a plurality of second select transistors each having a current path with one end connected to the other end of the current path of an associated one of the memory cell strings;
a source line which is electrically connected to the other end of the current path of an associated one of the first select transistors; and
a bit line which is electrically connected to the other end of the current path of an associated one of the second select transistors,
wherein the first dummy cell is disposed on the source line side such that one end and the other end of the current path thereof are connected between the first select transistor and the memory cell, and a threshold voltage of the first dummy cell is higher than a neutral threshold voltage, and
the second dummy cell is disposed on the bit line side such that one end and the other end of the current path thereof are connected between the second select transistor and the memory cell.

9. The device according to claim 8, further comprising a dummy word line voltage generating circuit which executes control to apply a read pass voltage, which is higher than a read pass voltage of the memory cell, to a control electrode of the first dummy cell.

10. The device according to claim 9, wherein at a time of a write operation the dummy word line voltage generating circuit applies, to a control electrode of the second dummy cell, a write voltage that is between a write pass voltage, which is applied to the memory cell, and a write voltage.

11. The device according to claim 9, wherein a value of the voltage, which is applied to the first dummy cell by the dummy word line voltage generating circuit, is a half value between the voltage, which is applied to the control electrode of the memory cell, and the erase voltage.

12. The device according to claim 9, wherein at a time of an erase operation the dummy word line voltage generating circuit applies an erase voltage to a first dummy word line and a second dummy word line of a non-selected block.

13. The device according to claim 9, wherein at a time of an erase operation the dummy word line voltage generating circuit executes control to set a timing of applying the voltage to the control electrode of the first dummy cell to become earlier than a timing of applying the erase voltage.

14. The device according to claim 8, wherein the threshold voltage of the first and second dummy cells is set before data write in the memory cell.

15. A data erase method of a semiconductor memory device including a memory cell array which includes a plurality of memory cell strings each including a plurality of memory cells and a first dummy cell, which have current paths connected in series at one end and the other end thereof, a plurality of first select transistors each having a current path with one end connected to one end of a current path of an associated one of the memory cell strings, and a plurality of second select transistors each having a current path with one end connected to the other end of the current path of an associated one of the memory cell strings, the method comprising:
applying an erase voltage to a semiconductor substrate, applying a reference voltage to a word line which is connected to a control electrode of the memory cell, and applying a voltage, which has a value between the reference voltage and the erase voltage, to a first dummy word line which is connected to a control electrode of the first dummy cell.

16. The data erase method according to claim 15, wherein a timing of applying the voltage to the control electrode of the first dummy cell is set to be earlier than a timing of applying the erase voltage.

17. The data erase method according to claim 15, further comprising applying, following the application of the erase voltage, the reference voltage to the semiconductor substrate, the word lines of a selected block and a non-selected block, and the first dummy word line.

18. The data erase method according to claim 16, further comprising applying, following the application of the erase voltage, the reference voltage to the semiconductor substrate, the word lines of a selected block and a non-selected block, and the first dummy word line.

* * * * *